US012740421B1

(12) United States Patent
D'Souza et al.

(10) Patent No.: US 12,740,421 B1
(45) Date of Patent: Sep. 15, 2026

(54) MITIGATING SEMICONDUCTOR PACKAGE WARPAGE USING IMPROVED STIFFENER RING

(71) Applicant: OpenAI OpCo, LLC., San Francisco, CA (US)

(72) Inventors: Stephen D'Souza, Morgan Hill, CA (US); Anthony Forte, San Francisco, CA (US)

(73) Assignee: OpenAI OpCo, LLC, San Francisco, CA (US)

( * ) Notice: Subject to any disclaimer, the term of this patent is extended or adjusted under 35 U.S.C. 154(b) by 0 days.

(21) Appl. No.: 19/545,955

(22) Filed: Feb. 20, 2026

(51) Int. Cl.
*H10W 42/00* (2026.01)

(52) U.S. Cl.
CPC .................................. *H10W 42/121* (2026.01)

(58) Field of Classification Search
CPC ..................................................... H10W 42/12
See application file for complete search history.

(56) References Cited

U.S. PATENT DOCUMENTS

| | | | | |
|---|---|---|---|---|
| 10,515,869 | B1 * | 12/2019 | Yeh | H10W 40/255 |
| 2015/0179607 | A1 * | 6/2015 | Ho | H10P 90/1914 438/118 |
| 2015/0321905 | A1 * | 11/2015 | Gooch | G01J 5/20 257/433 |
| 2020/0273770 | A1 * | 8/2020 | Fang | G06V 40/1329 |
| 2022/0230969 | A1 * | 7/2022 | Yeh | H10P 72/74 |
| 2023/0066053 | A1 * | 3/2023 | Gong | H05K 1/0271 |
| 2024/0038615 | A1 * | 2/2024 | Zhao | H10W 40/22 |

* cited by examiner

*Primary Examiner* — Mounir S Amer
(74) *Attorney, Agent, or Firm* — Polsinelli PC

(57) ABSTRACT

A semiconductor package includes a substrate, a die mounted on the substrate, and a stiffener ring mounted on the substrate and surrounding at least a portion of the die. The stiffener ring includes at least a first portion and a second portion circumferentially disposed along a perimeter of the stiffener ring. The first portion is characterized by a first effective stiffness, and the second portion is characterized by a second effective stiffness different from the first effective stiffness.

17 Claims, 11 Drawing Sheets

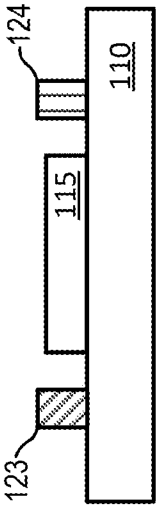
FIG. 2A
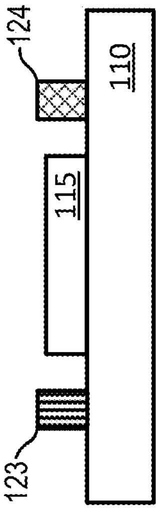
FIG. 2B
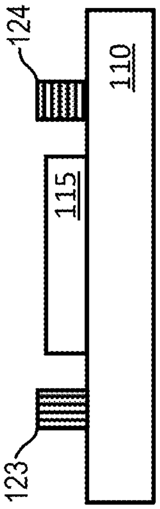
FIG. 2C
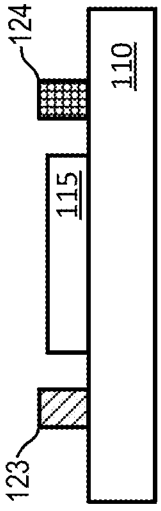
FIG. 2D
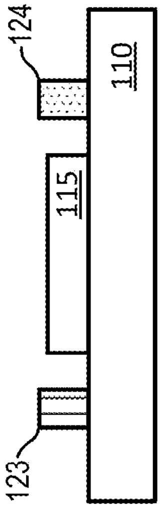
FIG. 2E
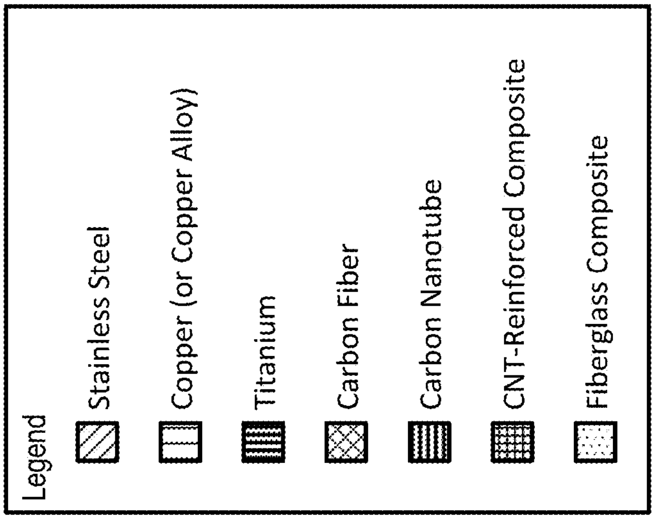
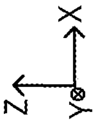
123
124
115
110
Legend
Stainless Steel
Copper (or Copper Alloy)
Titanium
Carbon Fiber
Carbon Nanotube
CNT-Reinforced Composite
Fiberglass Composite
Z
X
Y Taken at B-B' shown in FIG. 1A
Transition Region 410
Transition Profile 412a
124
T2
123
T1
110
Z
X
Y Taken at B-B' shown in FIG. 1A
Transition Region 410
Transition Profile 412b
124
T2
123
T1
110
Z
X
Y

700

Mount a stiffener ring on the substrate such that the stiffener ring surrounds at least a portion of the die, the stiffener ring comprising at least a first portion and a second portion circumferentially disposed along a perimeter of the stiffener ring, wherein the first portion is characterized by a first effective stiffness, and the second portion is characterized by a second effective stiffness different from the first effective stiffness
704

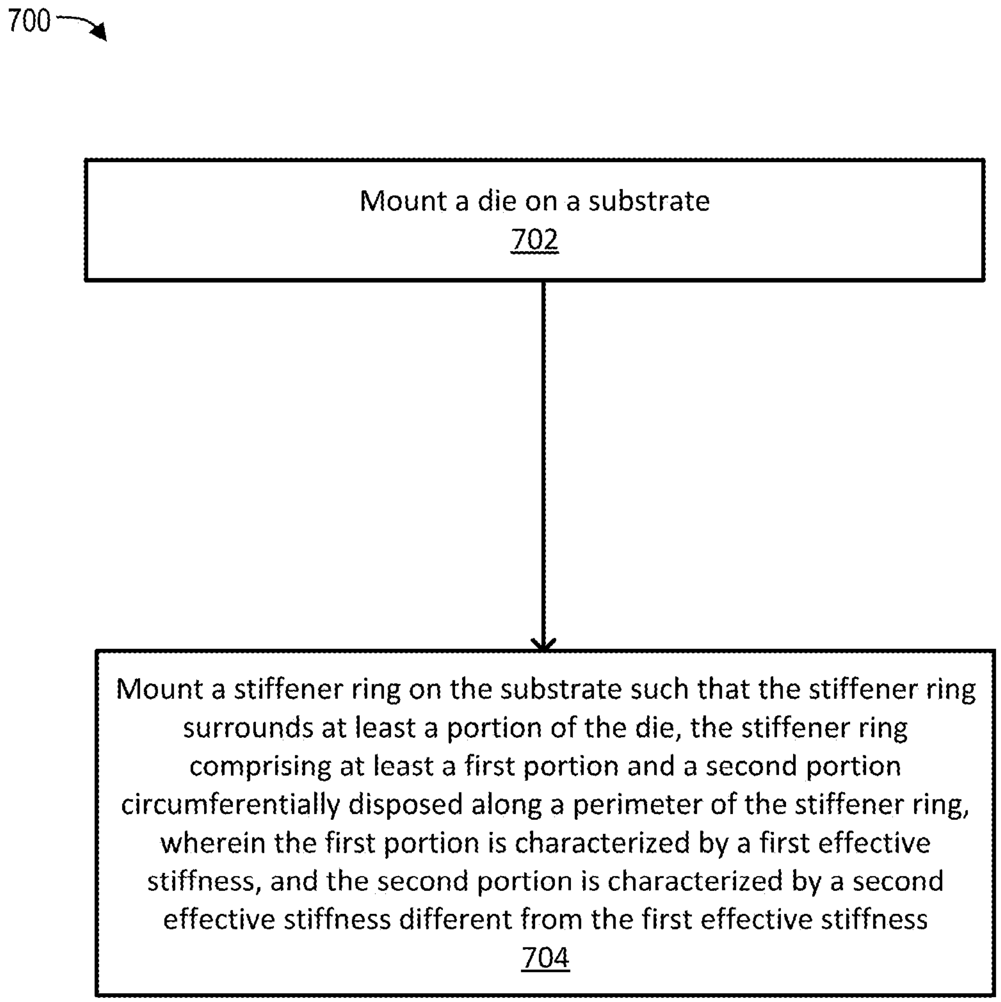

FIG. 7

MITIGATING SEMICONDUCTOR PACKAGE WARPAGE USING IMPROVED STIFFENER RING

BACKGROUND

Over the past decade, the field of artificial intelligence (AI) has undergone rapid and transformative development. The emergence of large-scale neural networks, data-driven learning algorithms, and specialized accelerators has enabled applications ranging from natural language processing and computer vision to generative models and autonomous systems. These advances have driven unprecedented computational demand, requiring vast training datasets and increasingly complex model architectures. As a result, the hardware and infrastructure supporting AI computation have become as critical to progress as the algorithms themselves.

Meeting these computational demands depends heavily on data center infrastructure. Modern AI workloads are powered by clusters of high-performance processors, such as graphics processing units (GPUs), tensor processing units (TPUs), or other custom application-specific integrated-circuit (ASIC) accelerators, that operate at extremely high power densities. Efficient cooling, power delivery, and modular scalability within these data centers are vital to maintaining reliability, performance, and cost efficiency. As AI models continue to grow in size and energy requirements, the design of compute systems and supporting facilities has become a central factor in enabling the next generation of AI innovation.

BRIEF DESCRIPTION OF THE SEVERAL VIEWS OF THE DRAWINGS

Details of one or more aspects of the subject matter described in this disclosure are set forth in the accompanying drawings and the description below. However, the accompanying drawings illustrate only some typical aspects of this disclosure and are therefore not to be considered limiting of its scope. Other features, aspects, and advantages will become apparent from the description, the drawings, and the claims.

FIG. 2A illustrates a first example cross-sectional view of the semiconductor package in accordance with some aspects of the present technology.

FIG. 2B illustrates a second example cross-sectional view of the semiconductor package in accordance with some aspects of the present technology.

FIG. 2C illustrates a third example cross-sectional view of the semiconductor package in accordance with some aspects of the present technology.

FIG. 2D illustrates a fourth example cross-sectional view of the semiconductor package in accordance with some aspects of the present technology.

FIG. 2E illustrates a fifth example cross-sectional view of the semiconductor package in accordance with some aspects of the present technology.

FIG. 7 illustrates an example method for forming a semiconductor package in accordance with some aspects of the present technology.

DETAILED DESCRIPTION

Figure 1A:
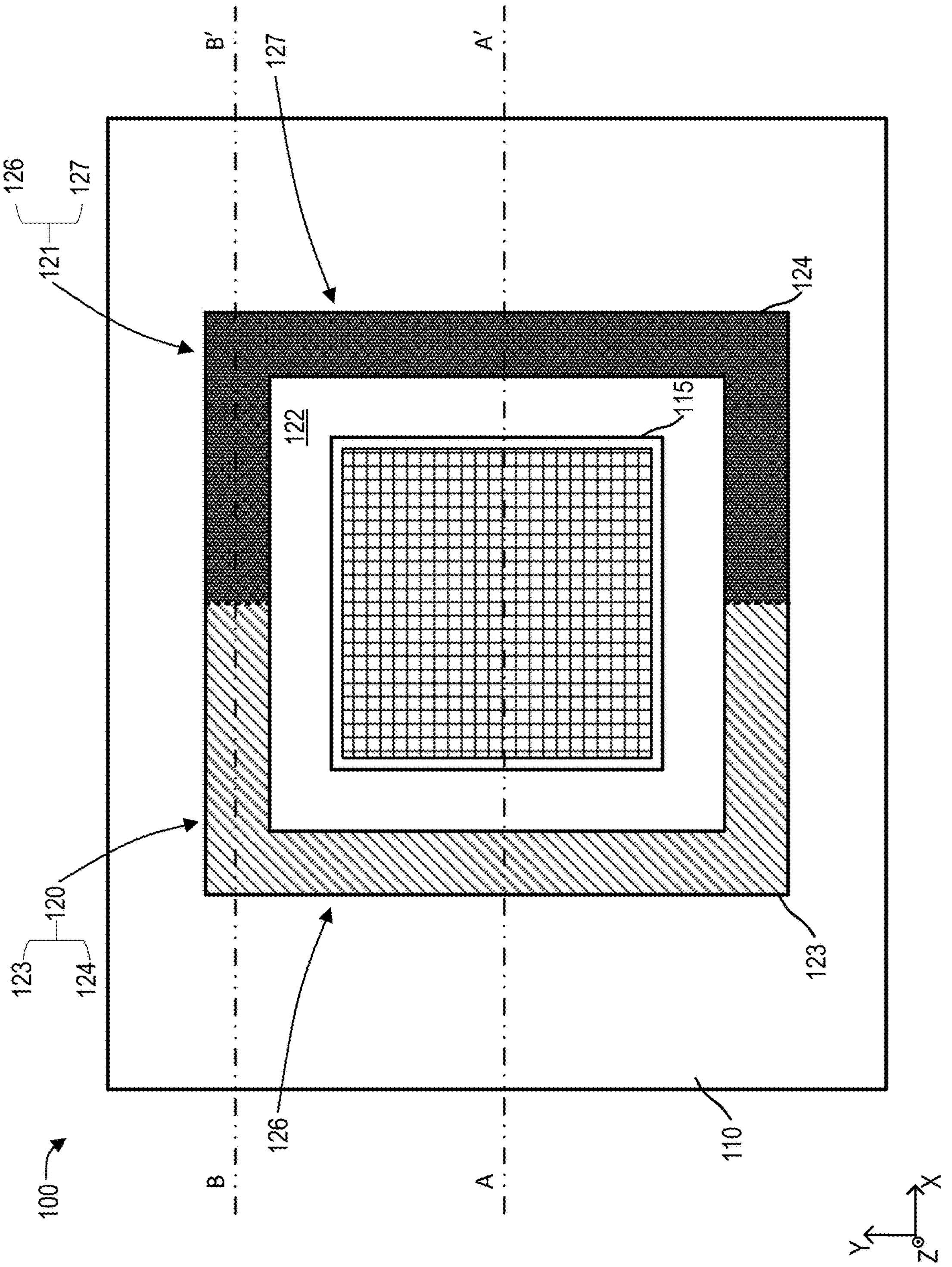
FIG. 1A illustrates an example top view of a semiconductor package in accordance with some aspects of the present technology.

As discussed above, advances in artificial intelligence have driven the development of increasingly large and complex models that rely on dense arrays of high-performance computing devices. Over the past few years, major industry players have initiated hyperscale infrastructure programs. One notable example is Stargate, a collaboration among OpenAI, Oracle, and SoftBank to build data centers dedicated to AI workloads. These facilities are designed to deploy multi-gigawatt AI compute capacity, demonstrating the scale of investment and ambition underpinning the current "compute arms race." In such environments, the physical infrastructure supporting compute elements is no longer incidental, but a critical determinant of system efficiency, cost, and capability.

The resulting computational demand has placed significant pressure on data center infrastructure, particularly in power delivery, thermal management, and mechanical integration. Each new generation of AI accelerators introduces higher thermal design power (TDP) requirements, often exceeding one kilowatt per device. When multiplied across thousands of processors per data hall (a main operational floor inside a data center where the racks, servers, and networking equipment are physically located), these power levels translate to megawatts of concentrated heat that must be managed continuously and reliably.

Semiconductor packages for high-performance computing devices, such as AI accelerators deployed in data centers, may include a package substrate (e.g., an organic substrate or a ceramic substrate), one or more dies mounted on the substrate, and solder interconnects (e.g., bumps or balls) that electrically and mechanically couple the package to a printed circuit board (PCB). In such packages, maintaining planarity of the package substrate is important for manufacturability and long-term reliability. As used herein, "warpage" generally refers to out-of-plane deformation of a semiconductor package (or a portion thereof), such as bowing, twisting, or localized curvature, which can occur due to thermal and mechanical stresses. Warpage may result from coefficient-of-thermal-expansion (CTE) mismatch among materials in a package stack-up, including (by way of non-limiting example) silicon die material, underfill material, build-up dielectric and metal layers, interconnect structures, lid or heat spreader structures, and solder materials. As package sizes increase and architectures become more heterogeneous in use cases like high-performance computing devices employed for data centers, the induced stresses may become increasingly spatially non-uniform, such that different regions of the package can experience different magnitudes and/or directions of deformation.

Warpage behavior is often temperature-dependent and may be evaluated across multiple temperature conditions that are relevant to assembly and use. In some implementations, warpage is evaluated at (i) an ambient or room temperature corresponding to a power-off or non-operating state (e.g., about 20-25° C.), (ii) an elevated temperature corresponding to a maximum operating condition (e.g., about 70-105° C. in some implementations, and in further implementations up to about 125° C. depending on product requirements), and (iii) a reflow temperature corresponding to a package-to-board attachment process (e.g., a peak reflow temperature of about 245-260° C. for lead-free solder reflow profiles). In some cases, a package may exhibit a concave deformation at one temperature and a convex deformation at another temperature, and in certain circumstances, the direction of warpage may flip across a temperature range. Such direction changes can be particularly problematic where repeated thermal cycling occurs. Warpage behavior may be estimated using simulation techniques (e.g., finite element analysis (FEA) or other modeling) prior to package fabrication and may additionally or alternatively be characterized using empirical measurements after fabrication. For example, optical or interferometric techniques, including shadow moiré measurements, may be used to characterize warpage at various temperatures, including at or approaching reflow temperatures. In some implementations, historical package data for related architectures may provide an initial estimate of expected warpage, while measurements from built packages are used to refine or validate models.

Warpage can adversely affect manufacturing yield and interconnect integrity during assembly processes. During solder reflow, a package is heated to a temperature at which solder becomes molten or semi-molten to form joints between the package and the PCB. If the package substrate is significantly warped during reflow, the solder interconnects may not be coplanar, resulting in incomplete joints, opens, or non-wetting (a soldering failure where molten solder fails to form a proper metallurgical bond with the metal surface of a component, substrate, or lead frame) in certain regions. In addition, excessive warpage can increase risk of solder bridging, shorting, and misalignment when ball pitch is tight or when package dimensions are large. Warpage may also impact underfill or adhesive processes by altering gap uniformity, which can contribute to voiding, non-uniform fillets, or stress concentrations after cure. These manufacturing effects are particularly significant in large packages where even small angular deviations can translate into substantial out-of-plane displacement at corners or edges. Accordingly, approaches that reduce warpage during reflow and related thermal processing can improve attach quality, reduce rework, and increase overall yield.

Warpage can also degrade reliability during operation, including during repeated transitions between lower-power and higher-power states that are typical in data center workloads. For example, warpage-induced mechanical stresses can contribute to fatigue of solder joints between the package and the PCB, leading to cracking, electrical intermittency, or failure over time. Warpage may also concentrate stresses at interfaces within the package (e.g., between die, underfill, and substrate), increasing risk of delamination or fracture. In addition, package warpage can adversely affect thermal interfaces. Where a thermal interface material (TIM), a substance placed between two mating surfaces to fill microscopic air gaps to facilitate efficient heat transfer through conduction, couples a die or lid to a cooling solution (e.g., a heat sink, cold plate, vapor chamber, or other cooler), dynamic changes in package curvature across a temperature range can produce a pumping effect that progressively displaces TIM from the intended interface region. This "pump-out" behavior can increase thermal resistance, elevate operating temperatures, and thereby further exacerbate stress and aging mechanisms. In high power-density environments, where each device may dissipate hundreds of watts to more than a kilowatt, such thermal and mechanical degradations can have outsized impact on system performance, uptime, and operating cost.

Semiconductor packages commonly incorporate stiffening structures to mitigate warpage and improve mechanical robustness. One example is a stiffener ring, which may comprise a frame-like structure mounted around a periphery of the package substrate (or around a region associated with a die attach area) to increase bending stiffness and constrain substrate deformation. In many implementations, a stiffener ring defines an opening that leaves a central region accessible, for example to permit underfill, direct die cooling, or lid attachment. The stiffener ring may be bonded to the package substrate using an adhesive, epoxy, or other bonding material, and may be attached before or after certain package assembly steps depending on the packaging process flow. Stiffener rings may be formed from metal materials (e.g., stainless steel, copper, copper alloys, titanium, or other metals) or from polymeric or epoxy materials. In addition to reducing warpage, stiffener rings can serve as structural supports that help distribute external loads (e.g., from a heat sink or cooling solution) so that solder interconnects are less likely to be crushed or excessively stressed. Where a lid or heat spreader is used, the stiffener ring may provide a bonding surface and may contribute to thermal conduction paths from the package to external cooling components.

Notwithstanding these benefits, conventional stiffener rings are frequently implemented as substantially uniform structures (e.g., having a single material composition and a substantially constant thickness (or cross-section) around the ring perimeter). As package architectures become more heterogeneous, however, the warpage behavior can become increasingly localized and asymmetric. For example, warpage may be affected by non-uniform die layouts, chipletbased designs, embedded capacitors, embedded power delivery structures, localized copper density variations, and other spatially varying features. As a result, a uniform stiffener ring may provide an "average" constraint that does not adequately counteract localized deformation in one region while potentially over-constraining another region. In some circumstances, attempts to address these issues by increases in ring thickness (e.g., using a trial-and-error approach) or the use of higher-stiffness monolithic materials can introduce additional problems, including increased package height, increased mass, and reduced clearance for neighboring components or connectors. These constraints can be particularly relevant in packages that incorporate co-packaged electrical or optical interfaces, vertical power delivery structures, or advanced cooling solutions that require tight vertical (i.e., "z-height") budgets and unobstructed regions near the package periphery.

The present technology provides semiconductor packages and stiffener rings that improve warpage control by configuring the stiffener ring with circumferentially distributed portions having different effective stiffnesses. In some implementations, a semiconductor package includes a substrate, a die mounted on the substrate, and a stiffener ring mounted on the substrate and surrounding at least a portion of the die, where the stiffener ring includes at least a first portion and a second portion disposed along a perimeter of the stiffener ring. The first portion may be characterized by a first effective stiffness, and the second portion may be characterized by a second effective stiffness different from the first effective stiffness. As used herein, "effective stiffness" refers to a mechanical stiffness characteristic of a portion of the stiffener ring as implemented in the package, which may reflect one or more of material elastic properties (e.g., elastic modulus), geometry (e.g., thickness, width, cross-sectional moment of inertia), and structural configuration (e.g., layered or laminated construction, fiber orientation, or inclusion of reinforcements). In some implementations, the effective stiffness is selected so that the stiffener ring reduces warpage across a temperature range, which may extend between an ambient temperature and a reflow temperature.

In some implementations, differences in effective stiffness between portions are established by varying material composition between portions (a "material approach"), by varying thickness profile between portions (a "thickness approach"), or by a combination thereof. Under the material approach, a first portion may comprise a first material and a second portion may comprise a second material different from the first material. By way of non-limiting example, at least one portion may comprise a metal (e.g., stainless steel, copper, copper alloy, titanium, or other metal), at least one portion may comprise a non-metal material (e.g., a polymeric material), at least one portion may comprise a composite material, and/or at least one portion may comprise a carbon-based material. Carbon-based materials may include, for example, carbon fiber materials and/or carbon nanotube-containing materials. In some implementations, a portion of the stiffener ring comprises a carbon fiber composite in which fiber orientation, weave pattern, or ply layup (i.e., arranging and placing individual layers of material in a specified sequence and orientation to build up a laminate or structure) is selected to provide greater stiffness in one direction and lower stiffness in another direction, thereby enabling regionally tailored constraint. In further implementations, a first portion comprises a metal and a second portion comprises a carbon-based material, such as a hybrid structure that leverages different material properties for different regions of the package.

In some implementations, one or more portions of the stiffener ring comprise laminated structures including multiple layers. For example, a first portion may comprise a laminated structure with a plurality of layers and a second portion may comprise a different laminated structure with a plurality of layers, where the two laminated structures differ in a number of layers, layer thicknesses, and/or layer material compositions. In such implementations, stiffness can be tuned by adjusting layer count and geometry, by selecting different materials for different layers (e.g., combining metallic layers with composite layers), and/or by modifying fiber orientation in composite layers. In some implementations, an inner layer may be selected for bonding compatibility, manufacturability, or other functional considerations, while one or more outer layers provide tailored stiffness characteristics. The laminated approach can enable a less monolithic stiffener ring that is customized for the warpage profile of a particular package design. In addition, such approaches can allow stiffness tailoring without necessarily increasing maximum ring height across all regions, which can be beneficial where system-level constraints (e.g., connector placement or cooling hardware clearance) restrict available z-height in portions of the package perimeter.

Under the thickness approach, a first portion of the stiffener ring may be characterized by a first thickness and a second portion may be characterized by a second thickness different from the first thickness. In some implementations, a transition between thicknesses is a stepped transition, while in other implementations, the transition is a tapered transition. In further implementations, a thickness profile varies within a portion. For example, a first portion may have a first thickness profile that varies along that portion, while a second portion may have a different thickness profile that varies along the second portion. Such thickness profiles can be used to provide increased stiffness in regions associated with higher warpage while maintaining reduced thickness in regions where lower stiffness is sufficient or where clearance is required for system components. For example, reduced stiffener thickness in selected regions can provide additional space for cooling solutions, fins, or other thermal structures that would otherwise be obstructed by a thicker ring, and can allow extended thermal coverage closer to the die region. Likewise, reduced thickness or reduced cross-sectional area in selected regions can provide clearance for connector systems or co-packaged interfaces located near the package periphery. In some implementations, the stiffener ring includes more than two portions (e.g., a third portion having a third effective stiffness different from the first and second), enabling finer-grained circumferential tailoring.

In further implementations, the effective stiffnesses of respective portions are selected based on estimated warpage characteristics associated with corresponding regions of the semiconductor package. For example, a first effective stiffness may be selected based on a first warpage characteristic associated with a first region of the package, and a second effective stiffness may be selected based on a second warpage characteristic associated with a second region different from the first region. Warpage characteristics may be estimated using simulation and/or based on measured data, including data taken at multiple temperatures (e.g., ambient, maximum operating temperature, and reflow temperature).

In further implementations, the technology may be embodied as a stiffener ring component itself, including a perimeter defining an opening and at least first and second circumferential portions characterized by different effective stiffnesses, which can be assembled into a semiconductor package using established bonding processes.

In addition to apparatus implementations, method implementations may include mounting one or more dies on a substrate and mounting a stiffener ring on the substrate such that the stiffener ring surrounds at least a portion of the die, where the stiffener ring includes circumferentially distributed portions of different effective stiffness. Moreover, in some implementations, a design process includes identifying regions of interest, estimating region-specific warpage behavior or characteristics, selecting effective stiffness targets for each region, and designing a stiffener ring with portions that implement those targets via material selection, thickness profiling, and/or lamination design.

Figure 1B:
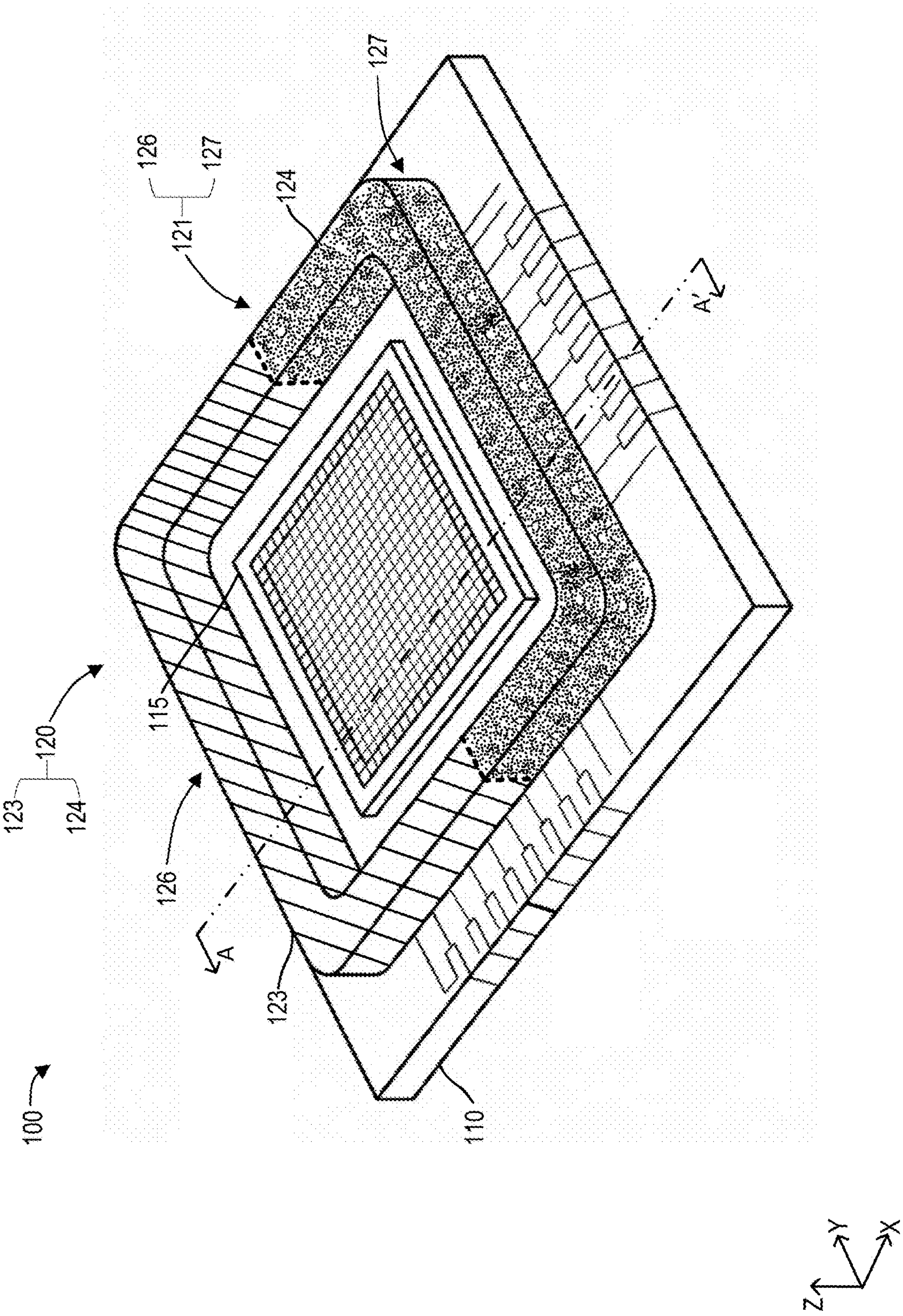
FIG. 1B illustrates an example perspective view of the semiconductor package shown in FIG. 1A in accordance with some aspects of the present technology.
Figure 1C:
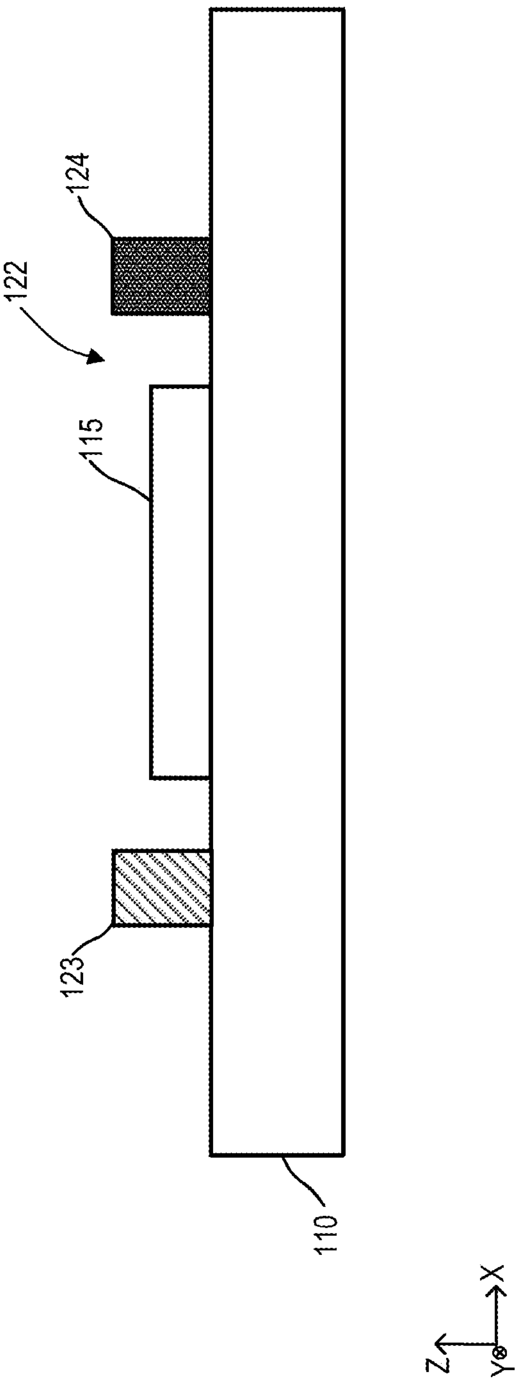
FIG. 1C illustrates an example cross-sectional view of the semiconductor package shown in FIG. 1A in accordance with some aspects of the present technology.

FIG. 1A illustrates an example top view of a semiconductor package 100 in accordance with some aspects of the present technology. FIG. 1B illustrates an example perspective view of the semiconductor package 100 shown in FIG. 1A in accordance with some aspects of the present technology. FIG. 1C illustrates an example cross-sectional view of the semiconductor package 100 shown in FIG. 1A in accordance with some aspects of the present technology. In the example shown in FIGS. 1A-1C, the semiconductor package 100 includes, among other components, a substrate 110, a die 115 mounted on the substrate 110, and a stiffener ring 120 mounted on (e.g., bonded to) the substrate 110 and surrounding at least a portion of the die 115. In the illustrated embodiment, the stiffener ring 120 is configured as a frame-like structure (therefore, sometimes also referred to as a "stiffener frame") that defines an opening 122 and surrounds (e.g., laterally surrounds in an X-Y plane shown in FIG. 1A) a region of the semiconductor package 100 where the die 115 is situated. As discussed in greater detail below, the stiffener ring 120 is used to increase mechanical rigidity (e.g., bending stiffness) of the substrate 110, and thereby mitigate package warpage that can arise from coefficient-of-thermal-expansion (CTE) mismatches among package constituents (e.g., die 115, underfill, substrate layers, solder interconnects). In many conventional packages, a stiffener ring is treated as a substantially uniform structure, which can provide limited ability to address localized or spatially non-uniform warpage behavior. By contrast, the stiffener ring 120 shown in FIGS. 1A-1C includes multiple circumferential portions (the first portion 123 and the second portion 124 in this example) having different effective stiffness characteristics, which can be selected to provide tailored mechanical constraint for different regions of the semiconductor package 100 and thereby improve warpage control across temperatures relevant to assembly and operation.

In general, as semiconductor packages (e.g., the semiconductor package 100) increase in size and/or incorporate more heterogeneous architectures (e.g., additional layers in the substrate 110, additional components coupled to the substrate 110, multiple dies 115 or chiplets (small, modular integrated circuits (ICs) designed to perform specific functions) mounted on the substrate 110, and/or more distinct power and input/output interfaces), package warpage can become more pronounced and can be spatially non-uniform across the semiconductor package 100. Excessive warpage of the semiconductor package 100 can create challenges during assembly operations, for example when attaching the semiconductor package 100 to a printed circuit board (PCB) via solder interconnects. Although the PCB and the solder interconnects are not shown in FIGS. 1A-1C for simplicity, but a person of ordinary skill in the art would comprehend that the semiconductor package 100 can be mounted to the PCB using solder balls, solder bumps, and/or other solder interconnects. Excessive warpage of the semiconductor package 100 can also contribute to reliability concerns during operation, for example, by increasing mechanical stresses on the solder interconnects and/or by creating non-uniform contact pressure and/or relative motion in one or more thermal interface materials (TIMs). In some implementations, warpage of the semiconductor package 100 can vary over a temperature range (e.g., from an ambient temperature checkpoint, to a maximum operating temperature checkpoint, and to a reflow temperature checkpoint), and in certain cases can transition between a concave warpage state and a convex warpage state as temperature changes. Accordingly, the stiffener ring 120 shown in FIGS. 1A-1C includes multiple circumferential portions (e.g., the first portion 123 and the second portion 124) having different effective stiffness characteristics, which can be selected to provide region-specific mechanical constraint for different regions of the semiconductor package 100 and thereby improve warpage control and associated manufacturability and/or reliability outcomes.

For purposes of illustration, FIG. 1A includes an example coordinate system identifying an X direction and a Y direction in a plane of the semiconductor package 100, and a Z direction orthogonal to the X-Y plane. Although the X, Y, and Z directions are shown as a convenient reference frame, a person of ordinary skill in the art would appreciate that the semiconductor package 100 can be oriented in any suitable manner in use, and that the coordinate system is provided for descriptive convenience rather than limitation. In the example shown in FIG. 1A, the substrate 110 provides a base structure of the semiconductor package 100, and the substrate 110 can include any suitable package substrate technology (e.g., a semiconductor substrate, an organic substrate, a ceramic substrate, an interposer, or a combination thereof). In the illustrated embodiment, the substrate 110 is shown with a generally rectangular footprint; however, a person of ordinary skill in the art would appreciate that the substrate 110 can have other footprints (e.g., square, polygonal, rounded-corner, or otherwise non-rectangular) depending on design constraints and system integration considerations.

As shown in FIG. 1A, the die 115 is mounted on the substrate 110 and is positioned within a region laterally surrounded by the stiffener ring 120. The die 115 can include, for example, an application-specific integrated circuit (ASIC), a graphics processing unit (GPU), a controller die, a memory die, a set of chiplets, a die stack (e.g., bonded together using, for example, fusion bonding or hybrid bonding), or any other suitable integrated circuit arrangement. Although the example shown in FIGS. 1A-1C depicts a single die 115, a person of ordinary skill in the art would appreciate that the semiconductor package 100 can include multiple dies 115 and/or other components mounted on the substrate 110 (e.g., one or more chiplets, memory devices, passive components, or active/passive interposers) within the opening 122 defined by the stiffener ring 120. In addition, while the die 115 is shown with a generally square footprint in FIG. 1A, the die 115 can have any suitable footprint (e.g., rectangular, polygonal, irregular) depending on the specific implementation. Certain package features that may be present around and/or under the die 115 are not shown in FIGS. 1A-1C for simplicity. For example, a die attach region and/or an underfill can be provided between the die 115 and the substrate 110, but is omitted in FIGS. 1A-1C to maintain clarity of the stiffener ring 120. Nevertheless, a person of ordinary skill in the art would comprehend that such elements can be included in the semiconductor package 100 consistent with the present technology.

As further shown in FIG. 1A, the stiffener ring 120 is disposed on the substrate 110 around the die 115 such that the stiffener ring 120 surrounds at least a portion of the die 115. In the illustrated embodiment, the stiffener ring 120 defines an opening 122 that provides space for the die 115 and/or other package structures in a central region of the semiconductor package 100. The opening 122 can be sized and shaped to accommodate the die 115 and, in some embodiments, to provide clearance for additional elements and/or assembly operations (e.g., underfill dispensing of the underfill, tooling access, or integration with a lid and/or heat spreader). Although the opening 122 is illustrated as generally rectangular in FIG. 1A, a person of ordinary skill in the art would appreciate that the opening 122 can have other shapes (e.g., square, circular, oval, polygonal, rounded-corner) and can be centered or offset relative to the substrate 110 depending on layout. In some embodiments, the stiffener ring 120 is mounted to the substrate 110 using a bond layer (e.g., an adhesive), which is not shown in FIGS. 1A-1C for simplicity. However, a person of ordinary skill in the art would comprehend that the stiffener ring 120 can be bonded to the substrate 110 using an adhesive bond layer and/or other suitable attachment techniques consistent with package assembly.

In the example shown in FIG. 1A, the stiffener ring 120 includes a perimeter 121 defining the opening 122. In some embodiments, the inner boundary of the stiffener ring 120 that bounds the opening 122 can be treated as the perimeter 121. In other embodiments, the outer boundary of the stiffener ring 120 that defines an outer footprint of the stiffener ring 120 on the substrate 110 can be treated as the perimeter 121. In still other embodiments, a person of ordinary skill in the art would appreciate that the perimeter 121 can be treated as any boundary, contour, or locus between the inner boundary and the outer boundary (e.g., a midline or other representative path) so long as the perimeter 121 substantially follows the geometry of the stiffener ring 120 around the opening 122. Stated another way, the perimeter 121 can be selected as a convenient reference line for describing circumferential position along the stiffener ring 120, and need not be limited to a specific edge of the stiffener ring 120. For purposes of describing circumferential stiffness variation, the perimeter 121 is conceptually subdivided into at least a first segment 126 and a second segment 127, where the first segment 126 corresponds to a first portion 123 of the stiffener ring 120 and the second segment 127 corresponds to a second portion 124 of the stiffener ring 120. Although FIG. 1A illustrates one example segmentation of the perimeter 121, a person of ordinary skill in the art would appreciate that the segmentation (e.g., the number of segments, the angular extent of segments, and segment boundaries) can be selected based on desired warpage control behavior, layout constraints, and/or manufacturing considerations.

A distinguishing feature introduced by FIGS. 1A-1C is that the stiffener ring 120 comprises multiple circumferentially distributed portions including, in this example, the first portion 123 and the second portion 124. In FIG. 1A, the first portion 123 and the second portion 124 are visually differentiated (e.g., using different shading or texture) to indicate that the first portion 123 is characterized by a first effective stiffness and the second portion 124 is characterized by a second effective stiffness different from the first effective stiffness. The first portion 123 is circumferentially disposed along the first segment 126 of the perimeter 121, and the second portion 124 is circumferentially disposed along the second segment 127 of the perimeter 121. As used herein, "circumferentially disposed" indicates that the first portion 123 and the second portion 124 extend along (e.g., follow) the perimeter 121 around the opening 122, rather than being defined solely by stacking in the Z direction or solely by radial placement relative to the opening 122. Although the example shown in FIG. 1A depicts the first portion 123 and the second portion 124 as complementary circumferential segments that together form a closed-loop stiffener ring 120, a person of ordinary skill in the art would appreciate that the number, arrangement, and boundaries of circumferential portions (the first portion 123 and the second portion 124 in this example shown in FIGS. 1A-1C) can vary in other embodiments (e.g., to include additional portions, different boundary locations, and/or asymmetric segmentation) while remaining within the scope of the present technology.

As stated above, FIG. 1B illustrates an example perspective view of the semiconductor package 100 shown in FIG. 1A in accordance with some aspects of the present technology. In the example shown in FIG. 1B, the stiffener ring 120 is mounted on the substrate 110 and extends in the Z direction relative to the X-Y plane of the substrate 110. As shown in FIG. 1B, the stiffener ring 120 laterally surrounds (e.g., in the X-Y plane) the region of the semiconductor package 100 where the die 115 is situated, and the stiffener ring 120 defines the opening 122 over the region where the die 115 is situated. Although FIG. 1B shows the stiffener ring 120 as a generally rectangular, frame-like structure, a person of ordinary skill in the art would appreciate that the stiffener ring 120 (and thus the perimeter 121) can have any suitable shape (e.g., square, rectangular, polygonal, rounded-corner, circular, or oval) depending on implementation.

FIG. 1B further illustrates that the stiffener ring 120 includes multiple circumferential portions (the first portion 123 and the second portion 124 in this example shown in FIGS. 1A-1C) disposed along the perimeter 121 of the stiffener ring 120. In the example shown in FIG. 1B, the first portion 123 and the second portion 124 are visually differentiated (e.g., using different shading or texture) to indicate that the first portion 123 is characterized by a first effective stiffness and the second portion 124 is characterized by a second effective stiffness different from the first effective stiffness. In some embodiments, the first effective stiffness associated with the first portion 123 and the second effective stiffness associated with the second portion 124 can be selected to reduce warpage of the semiconductor package 100 across a temperature range relevant to assembly and/or operation (e.g., across a temperature range including an ambient temperature checkpoint, a maximum operating temperature checkpoint, and/or a reflow temperature checkpoint), as described in greater detail below.

In the example shown in FIG. 1B, the stiffener ring 120 is depicted as having a generally uniform thickness and/or height in the Z direction. However, a person of ordinary skill in the art would appreciate that the first portion 123 and the second portion 124 can have different effective stiffness characteristics using, for example, a material/composition approach (e.g., by implementing the first portion 123 using a first material and implementing the second portion 124 using a second material different from the first material, and/or by using different laminated structures for the first portion 123 and the second portion 124) and/or a thickness/geometry approach (e.g., by implementing the first portion 123 with a first thickness and implementing the second portion 124 with a second thickness different from the first thickness, and/or by implementing different thickness profiles for the first portion 123 and the second portion 124). Although the material/composition approach and the thickness/geometry approach are discussed above as examples, a person of ordinary skill in the art would appreciate that any suitable combination of material selection, lamination design, and geometric configuration can be used to establish different effective stiffness characteristics for the first portion 123 and the second portion 124, consistent with the present technology.

As stated above, FIG. 1C illustrates an example cross-sectional view of the semiconductor package 100 shown in FIG. 1A in accordance with some aspects of the present technology. In particular, FIG. 1C is taken along line A-A' shown in FIG. 1A (and also shown in FIG. 1B). In the example shown in FIG. 1C, the semiconductor package 100 includes the substrate 110 and the die 115 mounted on the substrate 110. FIG. 1C further illustrates the stiffener ring 120 mounted on the substrate 110 such that the stiffener ring 120 surrounds at least a portion of the die 115, and such that the stiffener ring 120 defines the opening 122 over the region where the die 115 is situated. In the example shown in FIG. 1C, the stiffener ring 120 is depicted in cross-section as including the first portion 123 on a first side of the die 115 and the second portion 124 on a second side of the die 115 (e.g., an opposing side of the die 115), such that the opening 122 extends between the first portion 123 and the second portion 124.

FIG. 1C is simplified to emphasize the positional relationship among the substrate 110, the die 115, the stiffener ring 120, the first portion 123, the second portion 124, and the opening 122. Certain package features that may be present in the semiconductor package 100 are not shown in FIGS. 1A-1C for simplicity. For example, an underfill can be provided between the die 115 and the substrate 110, and/or within a die attach region, but the underfill is not shown in FIGS. 1A-1C for simplicity. In addition, a bond layer (e.g., a bond layer including an adhesive) can be provided between the stiffener ring 120 and the substrate 110 to mount the stiffener ring 120 to the substrate 110, but the bond layer is not shown in FIGS. 1A-1C for simplicity. Nevertheless, a person of ordinary skill in the art would comprehend that the underfill, the bond layer, and/or other attachment structures can be included in the semiconductor package 100 consistent with for example, various manufacturing, assembly, and reliability requirements.

In the example shown in FIG. 1C, the first portion 123 and the second portion 124 are depicted in a simplified manner and are not intended to require any particular implementation for establishing different effective stiffness characteristics of the first portion 123 and the second portion 124. For example, although FIG. 1C depicts the first portion 123 and the second portion 124 with generally similar cross-sectional thicknesses and/or heights, a person of ordinary skill in the art would appreciate that the first portion 123 and the second portion 124 can have different effective stiffness characteristics using, for example, the material/composition approach and/or the thickness/geometry approach, as described in greater detail below. As one example, the first portion 123 can be implemented using a first material and the second portion 124 can be implemented using a second material different from the first material. As another example, the first portion 123 can include a first laminated structure and the second portion 124 can include a second laminated structure different from the first laminated structure. As yet another example, the first portion 123 can be implemented with a first thickness and the second portion 124 can be implemented with a second thickness different from the first thickness, and/or the first portion 123 can include a first thickness profile and the second portion 124 can include a second thickness profile different from the first thickness profile. Although these examples are discussed for purposes of explanation, a person of ordinary skill in the art would appreciate that any suitable combination of material selection, lamination design, and geometric configuration can be used to establish different effective stiffness characteristics for the first portion 123 and the second portion 124, consistent with the present technology.

As used herein, an "effective stiffness" of a portion (e.g., the first portion 123 or the second portion 124) of the stiffener ring 120 refers to an effective mechanical stiffness behavior of that portion as it influences deformation of the semiconductor package 100, such as out-of-plane deformation (e.g., warpage) of the substrate 110 and associated package structures. In some embodiments, the effective stiffness can be understood as a bending stiffness, a flexural rigidity, a torsional stiffness, and/or another mechanical constraint metric that characterizes how strongly the stiffener ring 120 resists deformation and/or constrains deformation of the substrate 110 under thermal and/or mechanical loading. In this regard, the effective stiffness associated with the first portion 123 and the effective stiffness associated with the second portion 124 can be selected such that the stiffener ring 120 provides different mechanical constraint in different circumferential locations around the opening 122 (e.g., different mechanical constraint along the perimeter 121), thereby enabling region-specific warpage control. Although "effective stiffness" is discussed above as a mechanical metric, a person of ordinary skill in the art would appreciate that the effective stiffness of the first portion 123 and the effective stiffness of the second portion 124 can reflect one or more contributing factors (e.g., material properties, internal structure such as lamination, geometric parameters such as thickness and/or cross-sectional profile, etc.), and the present technology is not limited to any particular mechanism by which the effective stiffness of the first portion 123 differs from the effective stiffness of the second portion 124.

In some embodiments, the effective stiffness of a portion of the stiffener ring 120 (e.g., the first portion 123 or the second portion 124) can be characterized, estimated, and/or validated using one or more measurement techniques and/or one or more simulation techniques.

By way of example, in measurement-based characterization, a test specimen can be fabricated to represent the first portion 123 and/or the second portion 124, such as (i) a coupon having a material composition representative of the first portion 123 or the second portion 124, (ii) a coupon having a cross-sectional geometry (e.g., thickness and/or profile) representative of the first portion 123 or the second portion 124, (iii) a segment of the stiffener ring 120 corresponding to the first portion 123 or the second portion 124, and/or (iv) a full stiffener ring 120 including the first portion 123 and the second portion 124. The test specimen can then be mechanically loaded in a laboratory setting to directly measure stiffness-related responses, for example using one or more of a three-point bend test, a four-point bend test, a cantilever deflection test, a uniaxial tension/compression test, a torsion test, and/or a dynamic mechanical analysis (DMA) test. In such implementations, a typical measurement output can include a load-deflection curve (or torque-angle curve), from which one or more stiffness parameters can be derived, such as an elastic modulus, a flexural modulus, a spring constant, a bending stiffness (e.g., an effective EI), a torsional stiffness, and/or another metric indicative of the effective stiffness of the first portion 123 and/or the effective stiffness of the second portion 124. In some embodiments, such measurements can be performed at one or more temperatures (e.g., at an ambient/room-temperature condition, at an elevated temperature condition, and/or after thermal cycling) to characterize temperature dependence of the effective stiffness of the first portion 123 and/or the effective stiffness of the second portion 124.

In simulation-based characterization, the effective stiffness of the first portion 123 and the effective stiffness of the second portion 124 can be treated as design parameters and evaluated using mechanical modeling tools such as finite element analysis (FEA) tools configured to model thermo-mechanical behavior of the semiconductor package 100 (e.g., to model warpage of the substrate 110 in response to CTE mismatch and thermal loading), including, by way of example, commercially available FEA frameworks. Although particular measurement and simulation techniques are discussed above as examples, a person of ordinary skill in the art would appreciate that any suitable combination of measurement-based warpage characterization and/or simulation-based warpage estimation can be used to select, tune, and/or verify the effective stiffness of the first portion 123 and the effective stiffness of the second portion 124, consistent with the present technology.

In some embodiments, configuring the stiffener ring 120 such that the first portion 123 has a first effective stiffness and the second portion 124 has a second effective stiffness different from the first effective stiffness can improve manufacturability and/or reliability of the semiconductor package 100. For example, because warpage of the semiconductor package 100 can be spatially non-uniform, providing different effective stiffness characteristics in different circumferential locations (e.g., using the first portion 123 and the second portion 124 in this example shown in FIGS. 1A-1C) can provide tailored mechanical constraint for different regions of the substrate 110, which can reduce warpage-related challenges during assembly (e.g., during attachment to a PCB via solder interconnects) and/or reduce warpage-related stresses during operation.

By way of example, a first region of the substrate 110 (e.g., a corner region of the substrate 110 and/or an edge region of the substrate 110 adjacent a high-stress package feature) can exhibit relatively severe out-of-plane deformation during thermal excursions, whereas a second region of the substrate 110 (e.g., a region closer to a center of the substrate 110 and/or a region that is mechanically constrained by the die 115 and associated structures) can exhibit relatively mild warpage, or can remain substantially planar under the same conditions. In such embodiments, the first effective stiffness of the first portion 123 and the second effective stiffness of the second portion 124 can be selected such that the stiffener ring 120 provides greater mechanical constraint proximate the first region of the substrate 110 and provides lesser mechanical constraint proximate the second region of the substrate 110, thereby improving overall warpage control without over-constraining regions that do not require additional stiffening.

Although such benefits are described above as examples, a person of ordinary skill in the art would appreciate that the specific benefits realized can depend on, for example, the package architecture, the materials and geometry of the stiffener ring 120, and thermal and/or mechanical loading conditions.

FIG. 2A illustrates a first example cross-sectional view of the semiconductor package 100 in accordance with some aspects of the present technology. FIG. 2B illustrates a second example cross-sectional view of the semiconductor package 100 in accordance with some aspects of the present technology. FIG. 2C illustrates a third example cross-sectional view of the semiconductor package 100 in accordance with some aspects of the present technology. FIG. 2D illustrates a fourth example cross-sectional view of the semiconductor package 100 in accordance with some aspects of the present technology. FIG. 2E illustrates a fifth example cross-sectional view of the semiconductor package 100 in accordance with some aspects of the present technology.

Like the embodiment shown in FIG. 1C, the semiconductor package 100 shown in FIGS. 2A-2E includes, among other components, the substrate 110, the die 115 mounted on the substrate 110, and the stiffener ring 120 mounted on the substrate 110 such that the stiffener ring 120 surrounds at least a portion of the die 115. In particular, FIGS. 2A-2E schematically illustrate a material/composition approach in which the first portion 123 of the stiffener ring 120 comprises a first material and the second portion 124 of the stiffener ring 120 comprises a second material different from the first material. In the examples shown in FIGS. 2A-2E, different materials are illustrated using different shading or texture (e.g., as indicated by the legend). In some embodiments, selecting different materials for the first portion 123 and the second portion 124 can be used to establish different effective stiffnesses for the first portion 123 and the second portion 124 (e.g., to provide different mechanical constraint in different circumferential locations around the die 115 or around the opening 122 described above with respect to FIGS. 1A-1C). Although FIGS. 2A-2E schematically depict the first portion 123 and the second portion 124 without showing certain intervening structures, a person of ordinary skill in the art would comprehend that the stiffener ring 120 (including the first portion 123 and the second portion 124) can be mounted to the substrate 110 using, for example, a bond layer, and that the die 115 can be mounted to the substrate 110 with, for example, a die attach region and/or an underfill, as described above.

In the first example shown in FIG. 2A, the first portion 123 comprises stainless steel and the second portion 124 comprises copper (or copper alloy). Stainless steel is generally an iron-based alloy that includes chromium (and, in some cases, other alloying elements), and stainless steel is employed because it can provide relatively high stiffness, good strength, and good corrosion resistance while being compatible with common manufacturing processes (e.g., stamping, machining, and/or forming). Copper is generally a metal known for relatively high thermal conductivity and, in some implementations, can provide advantages for thermal spreading and/or thermal uniformity, while also providing a stiffness contribution. In the example shown in FIG. 2A, using stainless steel for the first portion 123 and using copper (or copper alloy) for the second portion 124 can provide different effective stiffnesses for the first portion 123 and the second portion 124, for example due to differences in elastic modulus, coefficient of thermal expansion (CTE), density, and/or other material properties. Although stainless steel and copper (or copper alloy) are illustrated as examples in FIG. 2A, a person of ordinary skill in the art would appreciate that "stainless steel" can include a variety of stainless steel families and grades (e.g., 300-series stainless steels as examples), and that "copper (or copper alloy)" can include pure copper and/or copper alloys selected for mechanical, thermal, corrosion, and/or manufacturability considerations.

In the second example shown in FIG. 2B, the first portion 123 comprises titanium and the second portion 124 comprises carbon fiber. Titanium is a metal that can provide a relatively favorable strength-to-weight ratio and corrosion resistance, and titanium (including titanium alloys) can exhibit a coefficient of thermal expansion (CTE) that is lower than that of many common metals, which can be beneficial in reducing CTE mismatch-driven deformation in some implementations. Carbon fiber is a carbon-based reinforcing fiber material, typically used in the form of a fiber-reinforced composite, and carbon fiber-based constructions are often associated with relatively high specific stiffness (stiffness per unit weight) and, depending on fiber orientation and architecture, can provide relatively low CTE in one or more directions. Accordingly, in some embodiments, selecting titanium for the first portion 123 and selecting carbon fiber for the second portion 124 can provide a stiffness and CTE combination that is different from the stainless steel and copper (or copper alloy) combination described above, thereby enabling different stiffness engineering options for different regions of the semiconductor package 100. Although titanium and carbon fiber are illustrated as examples in FIG. 2B, a person of ordinary skill in the art would appreciate that titanium can include titanium alloys (e.g., Ti-6Al-4V as one non-limiting example), and that carbon fiber can include different carbon fiber types and constructions (including, for example, high-temperature resistant carbon fiber), consistent with the present technology.

In the third example shown in FIG. 2C, the first portion 123 comprises titanium and the second portion 124 comprises carbon nanotube. Carbon nanotubes are carbon-based nanostructures that can exhibit relatively high mechanical strength and stiffness at the nanoscale, and carbon nanotube material can be incorporated into macroscopic structures in various ways (e.g., as a film, as an aligned fiber/yarn form, as a nonwoven mat, and/or as a reinforcement phase in a composite). In some embodiments, incorporating carbon nanotube into the second portion 124 can enable a stiffness contribution and/or a tailored thermomechanical response (e.g., tailored modulus and/or tailored CTE behavior) while also enabling relatively low weight. In the example shown in FIG. 2C, selecting titanium for the first portion 123 and selecting carbon nanotube for the second portion 124 provides another non-limiting example of how the first portion 123 and the second portion 124 can be implemented using different materials to achieve different effective stiffnesses. Although carbon nanotube is illustrated as an example in FIG. 2C, a person of ordinary skill in the art would appreciate that carbon nanotube can include, for example, single-walled carbon nanotubes, multi-walled carbon nanotubes, and/or mixtures thereof, and can be implemented in different forms (e.g., aligned and/or randomly oriented), depending on desired stiffness behavior and manufacturing considerations.

In the fourth example shown in FIG. 2D, the first portion 123 comprises stainless steel and the second portion 124 comprises a CNT-reinforced composite. A CNT-reinforced composite generally refers to a composite material in which carbon nanotubes are incorporated as a reinforcement phase within a matrix material, which can be selected to improve one or more mechanical properties (e.g., stiffness, strength, and/or toughness) and, in some implementations, to influence thermal properties (e.g., thermal conductivity) and/or thermomechanical properties (e.g., CTE behavior). In some embodiments, the matrix material can be a polymeric matrix, an epoxy matrix, a ceramic matrix, a metal matrix, and/or another suitable matrix selected based on temperature capability, manufacturability, and compatibility with the substrate 110 and/or a bond layer. In the example shown in FIG. 2D, selecting stainless steel for the first portion 123 and selecting a CNT-reinforced composite for the second portion 124 can provide a stiffness engineering option that differs from, for example, carbon fiber or carbon nanotube alone, while still leveraging carbon-based reinforcement to tune effective stiffnesses of the second portion 124.

In the fifth example shown in FIG. 2E, the first portion 123 comprises copper (or copper alloy) and the second portion 124 comprises a fiberglass composite. A fiberglass composite (also referred to as a glass-fiber composite) generally refers to a composite material that includes glass fibers as reinforcement, and fiberglass composites can provide a combination of strength, stiffness, corrosion resistance, and manufacturability at relatively moderate cost. In some implementations, fiberglass composites can also provide electrical insulation characteristics, which can be relevant for certain package architectures. As one familiar example, fiberglass-reinforced epoxy materials are commonly used in printed circuit board (PCB) laminates (e.g., FR-4 materials), although the present technology is not limited to any particular fiberglass composite type or formulation. In the example shown in FIG. 2E, selecting copper (or copper alloy) for the first portion 123 and selecting a fiberglass composite for the second portion 124 provides another non-limiting example of how the first portion 123 and the second portion 124 can be implemented using different materials to achieve different effective stiffnesses.

Although FIGS. 2A-2E illustrate particular material combinations for the first portion 123 and the second portion 124, a person of ordinary skill in the art would appreciate that the illustrated combinations are examples, and that many other material combinations can be used consistent with the present technology to engineer stiffness and/or thermomechanical behavior of the stiffener ring 120. For example, in some embodiments, the first portion 123 can comprise stainless steel, copper (or copper alloy), titanium, and/or another metal selected based on stiffness, CTE, manufacturability, and/or cost (e.g., nickel-based alloys, aluminum-based alloys, or other engineering metals). In some embodiments, the second portion 124 can comprise carbon fiber, carbon nanotube, a CNT-reinforced composite, a fiberglass composite, and/or another composite or non-metal material selected based on stiffness engineering objectives and temperature capability (e.g., high-temperature polymeric materials, ceramic-based materials, or hybrid materials). In addition, in some embodiments, the material selection for the first portion 123 and the material selection for the second portion 124 can be reversed relative to the examples shown in FIGS. 2A-2E (e.g., copper (or copper alloy) can be used in the first portion 123 and stainless steel can be used in the second portion 124), and/or additional materials can be used in conjunction with the first portion 123 and/or the second portion 124, depending on the desired stiffness distribution around the semiconductor package 100.

Figure 3A:
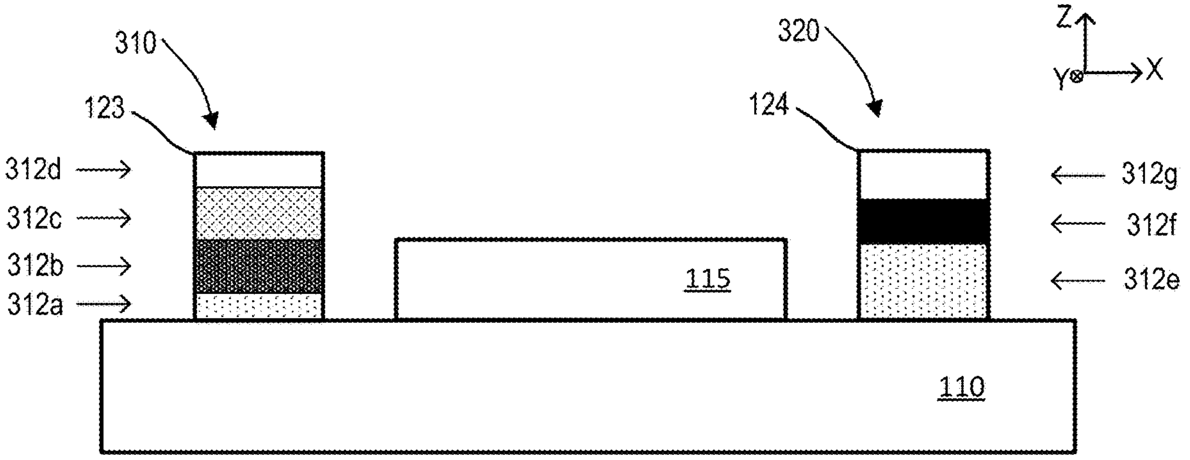
FIG. 3A illustrates an example cross-sectional view of the semiconductor package including laminated structures in accordance with some aspects of the present technology.

FIG. 3A illustrates an example cross-sectional view of the semiconductor package 100 in accordance with some aspects of the present technology. In the example shown in FIG. 3A, the semiconductor package 100 includes the substrate 110 and the die 115 mounted on the substrate 110. FIG. 3A further illustrates the first portion 123 and the second portion 124 of the stiffener ring 120 (e.g., the stiffener ring

120 described above with reference to FIGS. 1A-1C) disposed on the substrate 110 on opposing sides of the die 115. In the example shown in FIG. 3A, the first portion 123 comprises a first laminated structure 310, and the second portion 124 comprises a second laminated structure 320 that is different from the first laminated structure 310.

In the example shown in FIG. 3A, the first laminated structure 310 of the first portion 123 includes layers 312*a*-312*d*. In particular, the layers 312*a*-312*d* are arranged in a stack (e.g., along the Z direction) such that the layer 312*a* is an innermost layer (e.g., closest to the substrate 110), and the layer 312*d* is an outermost layer (e.g., farthest from the substrate 110). Likewise, in the example shown in FIG. 3A, the second laminated structure 320 of the second portion 124 includes layers 312*e*-312*g* arranged in a stack (e.g., along the Z direction) such that the layer 312*e* is an innermost layer (e.g., closest to the substrate 110), and the layer 312*g* is an outermost layer (e.g., farthest from the substrate 110). Although FIG. 3A depicts the layers 312*a*-312*d* and the layers 312*e*-312*g* as stacked layers in cross-section, a person of ordinary skill in the art would appreciate that the layers 312*a*-312*d* and the layers 312*e*-312*g* can extend across a selected portion (or an entirety) of a circumferential extent of the stiffener ring 120 corresponding to the first portion 123 and the second portion 124, respectively.

FIG. 3A illustrates that the first laminated structure 310 of the first portion 123 and the second laminated structure 320 of the second portion 124 can differ in at least one of (i) a number of layers, (ii) layer thicknesses, and/or (iii) layer material compositions. For example, in the example shown in FIG. 3A, the first laminated structure 310 includes four layers (the layers 312*a*-312*d*), whereas the second laminated structure 320 includes three layers (the layers 312*e*-312*g*). As another example, in the example shown in FIG. 3A, the layers 312*a*-312*d* of the first laminated structure 310 have thicknesses that differ from one another, and the layers 312*e*-312*g* of the second laminated structure 320 have thicknesses that differ from one another (e.g., the layer 312*f* is shown as relatively thinner than the layer 312*e* and the layer 312*g*). In some embodiments, such differences between the first laminated structure 310 and the second laminated structure 320 can be selected to establish different effective stiffnesses for the first portion 123 and the second portion 124.

In the example shown in FIG. 3A, the different layers 312*a*-312*d* and the different layers 312*e*-312*g* are illustrated using different shading or texture to indicate that the layers 312*a*-312*d* and the layers 312*e*-312*g* can have different material compositions. In some embodiments, one or more of the layers 312*a*-312*d* and/or one or more of the layers 312*e*-312*g* can comprise a metal material (e.g., stainless steel, copper or copper alloy, titanium, or another alloy), a carbon-based material (e.g., carbon fiber and/or carbon nanotube material), a composite material (e.g., a CNT-reinforced composite and/or a fiberglass composite), a polymeric material (e.g., a high-temperature polymeric material), and/or a ceramic-based material. Although the foregoing materials are discussed as examples, a person of ordinary skill in the art would appreciate that the layers 312*a*-312*d* and the layers 312*e*-312*g* can be implemented using any suitable material or combination of materials selected to achieve target stiffness, target coefficient of thermal expansion (CTE), target density (e.g., weight constraints), target thermal properties (e.g., thermal conductivity), and/or target manufacturability for the first portion 123 and the second portion 124.

In some embodiments, the ordering of the layers 312*a*-312*d* within the first laminated structure 310 and the ordering of the layers 312*e*-312*g* within the second laminated structure 320 can be selected to tune the effective stiffnesses of the first portion 123 and the second portion 124. For example, in some embodiments, an outermost layer (e.g., the layer 312*d* and the layer 312*g*) can be selected to function as a relatively stiff "shell" layer and/or a protective layer, while an innermost layer (e.g., the layer 312*a* and the layer 312*e*) can be selected to function as a baseline stiffness layer and/or a CTE-matching layer. In some embodiments, one or more intermediate layers (e.g., the layer 312*b*, the layer 312*c*, the layer 312*f*) can be selected to adjust stiffness, damping, and/or thermomechanical response (e.g., to reduce stress concentrations or to provide a graded transition in properties through the thickness of the first laminated structure 310 and the second laminated structure 320). Although outermost, innermost, and intermediate roles are described above as examples, a person of ordinary skill in the art would appreciate that the roles of particular layers can vary based on the selected material compositions, thicknesses, and ordering of the layers 312*a*-312*d* and the layers 312*e*-312*g*.

In some embodiments, the first laminated structure 310 and the second laminated structure 320 can be fabricated using any suitable technique for forming a layered structure. For example, in some embodiments, the layers 312*a*-312*d* of the first laminated structure 310 and the layers 312*e*-312*g* of the second laminated structure 320 can be formed by stacking and bonding pre-formed sheets, by co-curing or co-molding composite layers, by cladding or roll-bonding dissimilar materials, by diffusion bonding, brazing, soldering, or by adhesive bonding. In some embodiments, one or more bond layers can be disposed between adjacent layers (not shown in FIG. 3A for simplicity), and a person of ordinary skill in the art would appreciate that such bond layers can be selected based on, for example, compatibility with the layer materials, temperature capability, and reliability requirements (e.g., resistance to delamination under thermal cycling). Although particular fabrication techniques are discussed above as examples, a person of ordinary skill in the art would appreciate that any suitable fabrication technique can be used to form the first laminated structure 310 and the second laminated structure 320, consistent with the present technology.

FIG. 3A therefore illustrates a non-limiting example in which the first portion 123 of the stiffener ring 120 and the second portion 124 of the stiffener ring 120 are each implemented as a laminated structure (e.g., the first laminated structure 310 and the second laminated structure 320), and in which the first laminated structure 310 differs from the second laminated structure 320 to provide different effective stiffnesses for the first portion 123 and the second portion 124. Although FIG. 3A depicts the first laminated structure 310 and the second laminated structure 320 as differing in both layer count and layer thickness, a person of ordinary skill in the art would appreciate that the first laminated structure 310 and the second laminated structure 320 can differ in any one (or more) of layer count, layer thickness, and/or layer material composition. Further, although FIG. 3A depicts both the first portion 123 and the second portion 124 as laminated, a person of ordinary skill in the art would appreciate that, in other embodiments, one of the first portion 123 or the second portion 124 can be laminated while the other of the first portion 123 or the second portion 124 is non-laminated (e.g., monolithic as shown in FIGS. 2A-2E), provided that the first portion 123 and the second portion 124 have different effective stiffnesses, consistent with the present technology.

Figure 3B:
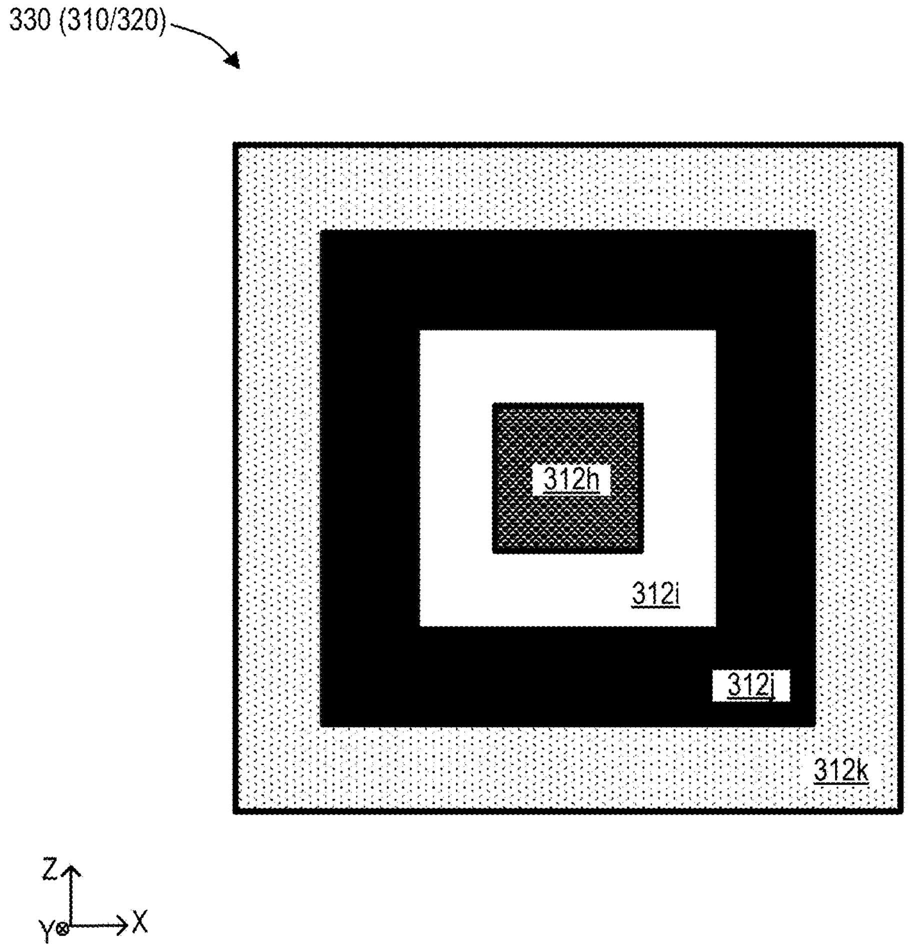
FIG. 3B illustrates an example cross-sectional view of a layered structure (e.g., a laminated structure) for implementing a laminated stiffener ring portion in accordance with some aspects of the present technology.

FIG. 3B illustrates an example cross-sectional view of a layered structure 330 (e.g., a laminated structure) in accordance with some aspects of the present technology. In some embodiments, the layered structure 330 shown in FIG. 3B can be used to implement the first laminated structure 310 and/or the second laminated structure 320 described above with reference to FIG. 3A (as indicated by the "310/320" label). For purposes of illustration, FIG. 3B includes an example coordinate system identifying an X direction and a Z direction, and a person of ordinary skill in the art would appreciate that the coordinate system is provided for descriptive convenience rather than limitation. For clarity of illustration, FIG. 3B omits other elements of the semiconductor package 100 (e.g., the substrate 110 and the die 115), and instead focuses on an example cross-sectional arrangement of layers that can be included in the first laminated structure 310 and the second laminated structure 320.

In the example shown in FIG. 3B, the layered structure 330 includes layers 312*h*-312*k*. In particular, the layer 312*h* is an innermost layer (e.g., an inner/core layer), and the layer 312*k* is an outermost layer (e.g., an outer/shell layer). In the example shown in FIG. 3B, the layer 312*i* and the layer 312*j* are intermediate layers disposed between the layer 312*h* and the layer 312*k*. As illustrated, the layer 312*k* can laterally surround (e.g., in cross-section) the layer 312*j*, the layer 312*j* can laterally surround the layer 312*i*, and the layer 312*i* can laterally surround the layer 312*h*. Although FIG. 3B depicts four layers 312*h*-312*k*, a person of ordinary skill in the art would appreciate that a layered structure can include any suitable number of layers (e.g., two layers, three layers, four layers, five layers, or more layers) arranged to provide desired stiffness and/or thermomechanical behavior.

FIG. 3B illustrates that the layered structure 330 can include layers that are arranged in cross-section such that one or more layers laterally surround one or more other layers. For example, whereas FIG. 3A depicts the layers 312*a*-312*d* and the layers 312*e*-312*g* as stacked layers, FIG. 3B depicts the layers 312*h*-312*k* as nested layers (e.g., concentric or shell-like layers) in cross-section. In some embodiments, such a nested-layer arrangement can be used in addition to, or as an alternative to, a stacked-layer arrangement to establish an effective stiffness of the first portion 123 and/or an effective stiffness of the second portion 124. In some embodiments, the nested-layer arrangement shown in FIG. 3B can be implemented such that the layers 312*h*-312*k* extend across a selected portion (or an entirety) of a circumferential extent of the stiffener ring 120 corresponding to the first portion 123 and/or the second portion 124.

In some embodiments, the layers 312*h*-312*k* can be selected to have different material compositions, different thicknesses, and/or different spatial extents within the cross-section to tune an effective stiffness of a corresponding stiffener ring portion. For example, in some embodiments, the outermost layer 312*k* can be selected to provide a relatively stiff shell and/or a protective layer, while the innermost layer 312*h* can be selected to provide a baseline stiffness layer and/or a coefficient-of-thermal-expansion (CTE)-matching layer. In some embodiments, the intermediate layers 312*i* and 312*j* can be selected to provide one or more of (i) a transition in stiffness, (ii) a transition in CTE, (iii) stress redistribution, and/or (iv) damping. In some embodiments, one or more of the layers 312*h*-312*k* can comprise, for example, a metal material (e.g., stainless steel, copper or copper alloy, titanium, or another alloy), a carbon-based material (e.g., carbon fiber and/or carbon nanotube material), a composite material (e.g., a CNT-reinforced composite and/or a fiberglass composite), a polymeric material (e.g., a high-temperature polymeric material), and/or a ceramic-based material. Although the foregoing materials are discussed as examples, a person of ordinary skill in the art would appreciate that the layers 312*h*-312*k* can be implemented using any suitable material or combination of materials selected to achieve target stiffness, target CTE, target density, target thermal properties, and/or target manufacturability.

In some embodiments, the layered structure 330 shown in FIG. 3B can be formed using any suitable technique for forming a multi-layer cross-section, including, for example, cladding, overmolding, encapsulation, bonding of preformed subcomponents, and/or other techniques suitable for producing a structure in which the layers 312*h*-312*k* remain distinct and contribute to mechanical stiffness. Although FIG. 3B illustrates one example nested-layer arrangement, a person of ordinary skill in the art would appreciate that the arrangement of the layers 312*h*-312*k* can be modified in other embodiments. For example, the layer 312*k* need not fully surround the layer 312*j*, one or more of the layers 312*h*-312*k* can be omitted, additional layers can be added, and/or the relative thicknesses of the layers 312*h*-312*k* can be adjusted, provided that the layered structure 330 (as a specific implementation of the first laminated structure 310 and/or the second laminated structure 320) establishes an effective stiffness for the first portion 123 and/or an effective stiffness for the second portion 124 consistent with the present technology.

Figure 4A:
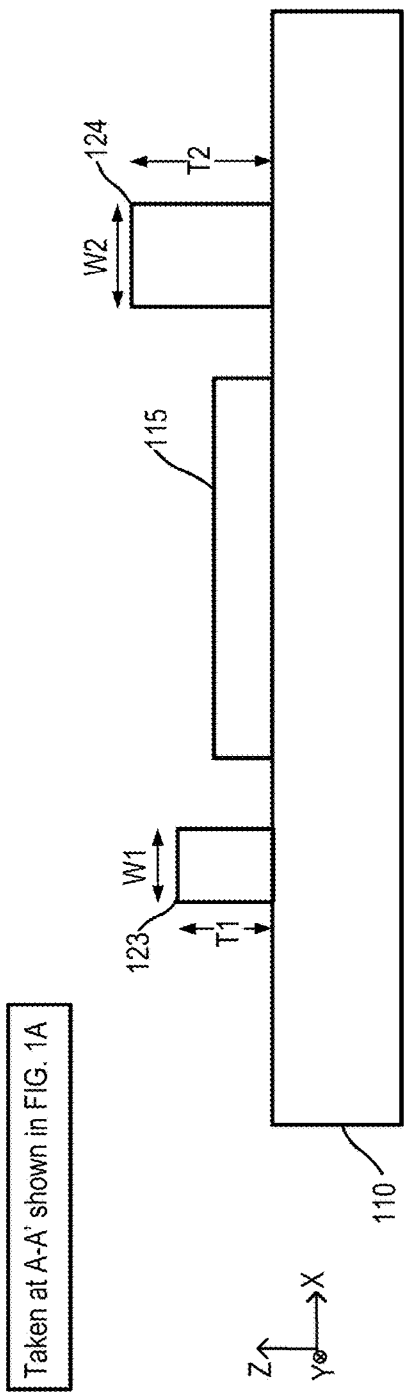
FIG. 4A illustrates a first example cross-sectional view of the semiconductor package including stiffener ring portions having different thicknesses in accordance with some aspects of the present technology.
Figure 4B:
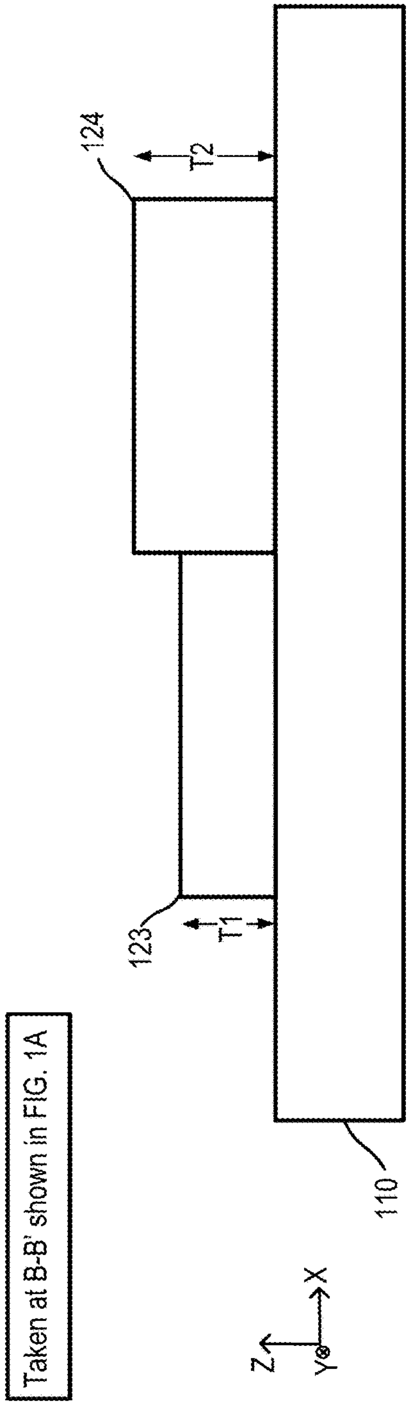
FIG. 4B illustrates a second example cross-sectional view of the semiconductor package taken through a transition between stiffener ring portions in accordance with some aspects of the present technology.
Figure 4C:
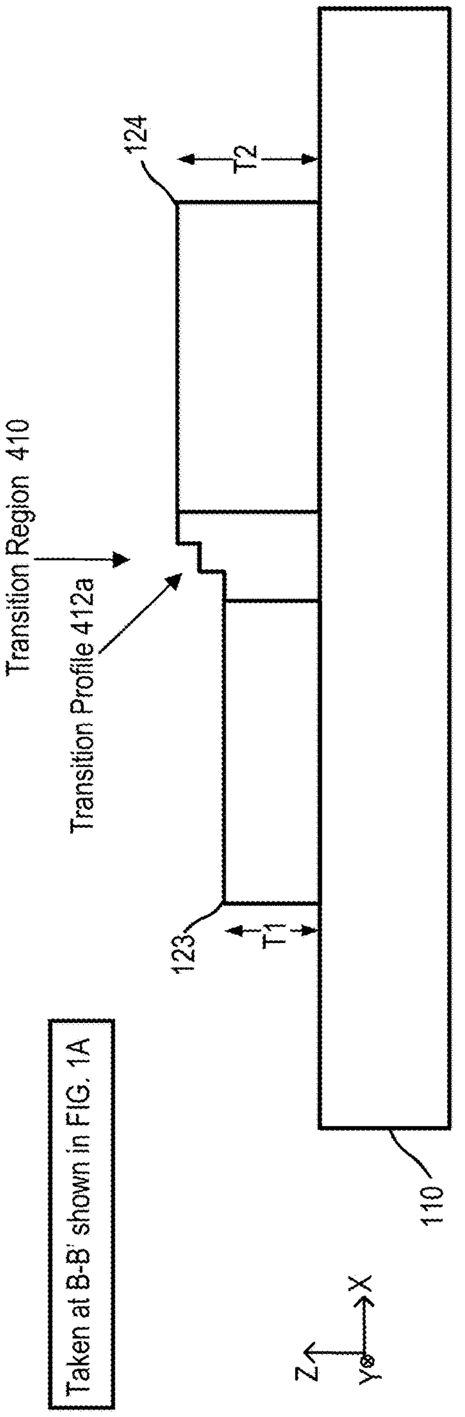
FIG. 4C illustrates a third example cross-sectional view of the semiconductor package including a stepped transition between stiffener ring portion thicknesses in accordance with some aspects of the present technology.
Figure 4D:
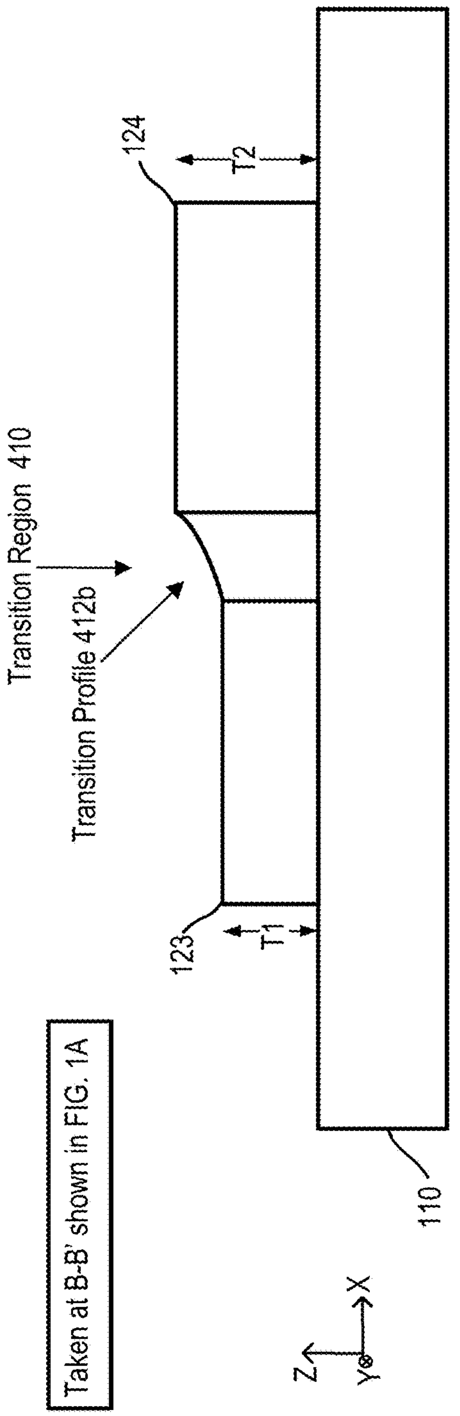
FIG. 4D illustrates a fourth example cross-sectional view of the semiconductor package including a tapered transition between stiffener ring portion thicknesses in accordance with some aspects of the present technology.

FIG. 4A illustrates a first example cross-sectional view of the semiconductor package 100 in accordance with some aspects of the present technology. FIG. 4B illustrates a second example cross-sectional view of the semiconductor package 100 in accordance with some aspects of the present technology. FIG. 4C illustrates a third example cross-sectional view of the semiconductor package 100 in accordance with some aspects of the present technology. FIG. 4D illustrates a fourth example cross-sectional view of the semiconductor package 100 in accordance with some aspects of the present technology.

FIGS. 4A-4D schematically illustrate a geometry-based implementation for establishing different effective stiffnesses of the first portion 123 and the second portion 124 of the stiffener ring 120. In the examples shown in FIGS. 4A-4D, the first portion 123 and the second portion 124 are configured such that the first portion 123 has a first thickness T1 and the second portion 124 has a second thickness T2 different from the first thickness T1. In some embodiments, the geometry-based implementation shown in FIGS. 4A-4D can be employed while holding material composition constant (e.g., the first portion 123 and the second portion 124 can comprise the same material), such that the different effective stiffnesses of the first portion 123 and the second portion 124 are established at least in part by geometry (e.g., by differing the first thickness T1 and the second thickness T2), rather than by differing material composition.

In the example shown in FIGS. 4A-4B, FIG. 4A is taken at A-A' shown in FIG. 1A, while FIG. 4B is taken at B-B' shown in FIG. 1A. FIG. 4A illustrates the substrate 110, the die 115 mounted on the substrate 110, the first portion 123 of the stiffener ring 120 disposed on a first side of the die 115, and the second portion 124 of the stiffener ring 120 disposed on a second side of the die 115. FIG. 4A further illustrates that, in the example shown in FIG. 4A, the first portion 123 has the first thickness T1 and the second portion 124 has the second thickness T2 different from the thickness T1. For purposes of illustration, FIG. 4A includes an example coordinate system identifying an X direction and a Z direction, and a person of ordinary skill in the art would appreciate that the coordinate system is provided for descriptive convenience rather than limitation.

FIG. 4A further illustrates example in-plane width parameters (e.g., the first width W1 and the second width W2) associated with the first portion 123 and the second portion 124, respectively. In particular, the first width W1 can represent a lateral (e.g., in-plane) extent of the first portion 123 in the cross-sectional view, and the second width W2 can represent a lateral (e.g., in-plane) extent of the second portion 124 in the cross-sectional view. In some embodiments, the width W1 and the width W2 can be selected to be substantially the same (e.g., to maintain a common footprint for the stiffener ring 120 around the die 115), while the thickness T1 and the thickness T2 are selected to be different to establish different effective stiffnesses of the first portion 123 and the second portion 124. In other embodiments, the first width W1 and the second width W2 can be different as well. Although FIG. 4A illustrates the width W1 and the width W2 for completeness, FIGS. 4A-4D are primarily discussed herein in the context of varying the thickness T1 and the thickness T2, including embodiments in which the width W1 and the width W2 are substantially equal.

In some embodiments, when the first portion 123 and the second portion 124 comprise the same material, a difference between the first thickness T1 of the first portion 123 and the second thickness T2 of the second portion 124 can establish a difference between an effective stiffness of the first portion 123 and an effective stiffness of the second portion 124. For example, when the first portion 123 and the second portion 124 comprise the same material, increasing thickness (e.g., increasing T2 relative to T1) generally increases a bending stiffness contribution of the corresponding portion because geometric stiffness (e.g., resistance to bending) depends on cross-sectional geometry. Accordingly, in some embodiments, selecting a relatively greater second thickness T2 for the second portion 124 than the first thickness T1 for the first portion 123 can cause the second portion 124 to provide greater mechanical constraint (e.g., greater resistance to bending) than the first portion 123, which can be used to tune warpage behavior of the semiconductor package 100, as described above.

In the example shown in FIG. 4B, FIG. 4B is taken at B-B' shown in FIG. 1A. In particular, the line B-B' in FIG. 1A passes through a transition between the first portion 123 and the second portion 124 of the stiffener ring 120 (e.g., through a boundary between a region associated with the first segment 126 and a region associated with the second segment 127). FIG. 4B illustrates the substrate 110 and illustrates the first portion 123 adjacent the second portion 124, with the first thickness T1 associated with the first portion 123 and the second thickness T2 associated with the second portion 124. In the example shown in FIG. 4B, FIG. 4B does not separately label a particular transition profile between the first portion 123 and the second portion 124, and instead illustrates that the first portion 123 and the second portion 124 can differ in thickness (T1 versus T2) at the transition between the first portion 123 and the second portion 124.

In contrast, FIGS. 4C and 4D illustrate non-limiting examples in which a transition between the first thickness T1 of the first portion 123 and the second thickness T2 of the second portion 124 is implemented using a transition region 410. In the examples shown in FIGS. 4C and 4D, FIGS. 4C and 4D are each taken at B-B' shown in FIG. 1A, and therefore illustrate cross-sectional geometry at a location that includes the transition between the first portion 123 and the second portion 124. In some embodiments, the transition region 410 can be configured to provide a desired transition between the first thickness T1 and the second thickness T2, for example to reduce stress concentrations, to reduce local discontinuities in stiffness, and/or to improve manufacturability, while still establishing different effective stiffnesses of the first portion 123 and the second portion 124.

In the example shown in FIG. 4C, the transition region 410 includes a transition profile 412*a* that is a stepped transition profile. In particular, the transition profile 412*a* includes multiple discrete steps between the first thickness T1 of the first portion 123 and the second thickness T2 of the second portion 124. Although FIG. 4C illustrates one example stepped transition profile 412*a*, a person of ordinary skill in the art would appreciate that the number of steps, the size of each step, and the location(s) of the steps can be selected based on design objectives (e.g., a desired stiffness transition from the first portion 123 to the second portion 124) and manufacturing considerations.

In the example shown in FIG. 4D, the transition region 410 includes a transition profile 412*b* that is a tapered transition profile. In particular, the transition profile 412*b* provides a gradual thickness transition between the first thickness T1 of the first portion 123 and the second thickness T2 of the second portion 124. Although FIG. 4D illustrates one example tapered transition profile 412*b*, a person of ordinary skill in the art would appreciate that the tapered transition profile 412*b* can have any suitable shape (e.g., a linear taper, a curved taper, a filleted transition, or another smooth transition) selected to provide a desired thickness transition between the first portion 123 and the second portion 124.

FIGS. 4A-4D therefore illustrate non-limiting examples in which the first portion 123 and the second portion 124 of the stiffener ring 120 differ in thickness (the first thickness T1 versus the second thickness T2), which can be used to establish different effective stiffnesses for the first portion 123 and the second portion 124 even when the first portion 123 and the second portion 124 comprise the same material. Although FIGS. 4A-4D illustrate an example in which the second thickness T2 of the second portion 124 is greater than the first thickness T1 of the first portion 123, a person of ordinary skill in the art would appreciate that the relative thicknesses can be reversed (e.g., the first thickness T1 can be greater than the second thickness T2), and that the thickness values can be selected based on warpage behavior targeted for different regions of the semiconductor package 100. Further, although FIGS. 4C and 4D illustrate a stepped transition profile 412*a* and a tapered transition profile 412*b*, respectively, a person of ordinary skill in the art would appreciate that other transition configurations can be used, and that a transition profile need not be limited to a particular geometry, provided that the first portion 123 and the second portion 124 have different effective stiffnesses consistent with the present technology.

Figure 5:
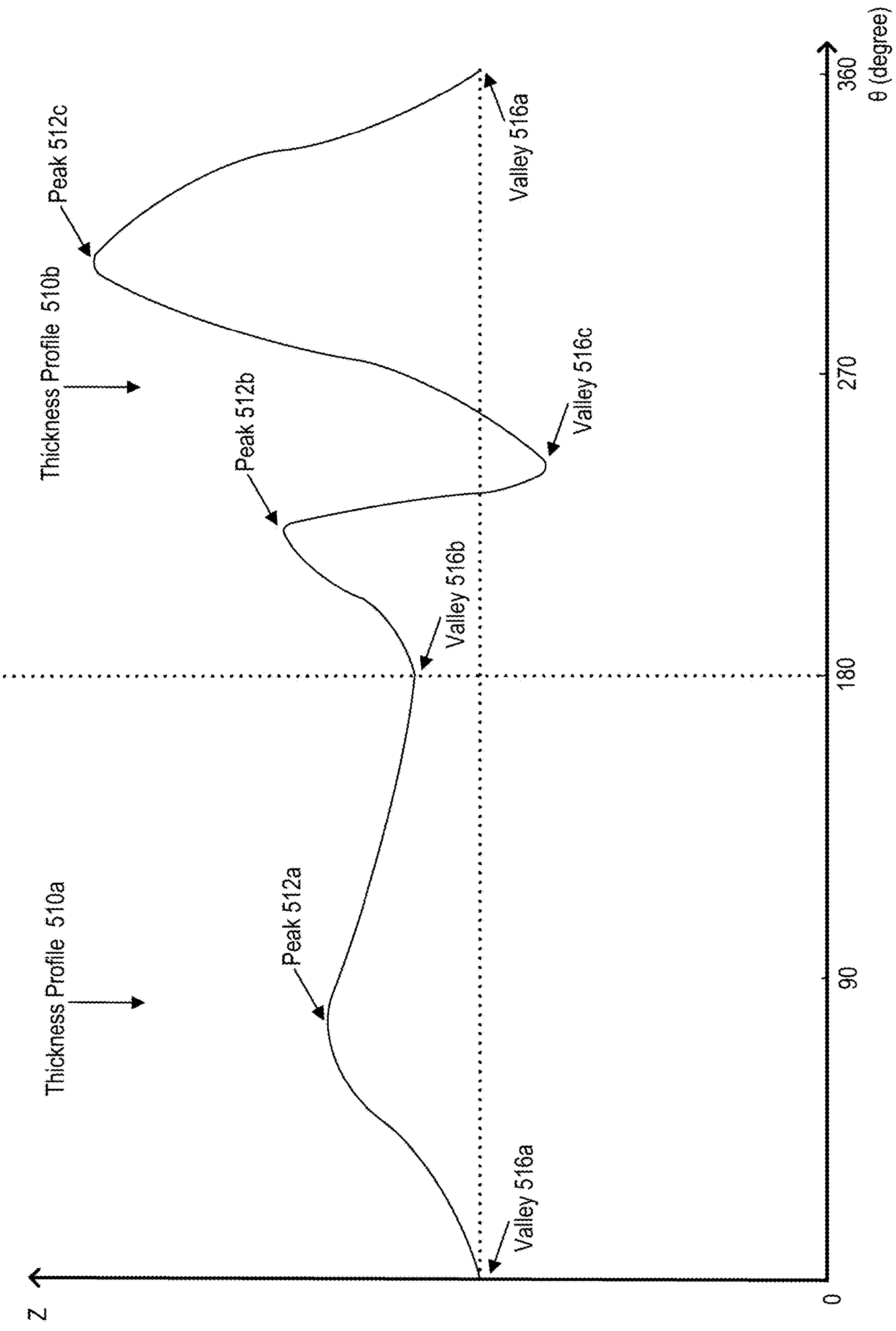
FIG. 5 illustrates an example thickness profile of a stiffener ring along a circumferential direction in accordance with some aspects of the present technology.

FIG. 5 illustrates an example thickness profile embodiment of the stiffener ring 120 in accordance with some aspects of the present technology. In the example shown in FIG. 5, an angular position θ (the unit of which is degree) along a circumferential direction of the stiffener ring 120 (e.g., along the perimeter 121 described above with reference to FIG. 1A) is plotted along a horizontal axis from 0° to 360°, and a thickness (e.g., a height in the Z direction) of the stiffener ring 120 is plotted along a vertical axis. FIG. 5 schematically illustrates that thickness of the stiffener ring 120 can vary as a function of circumferential position, and that such circumferential thickness variation can be used to establish different effective stiffnesses in different circumferential locations of the stiffener ring 120. For clarity of illustration, FIG. 5 omits other elements of the semiconductor package 100 (e.g., the substrate 110 and the die 115), and instead focuses on an example representation of thickness variation around the stiffener ring 120.

In the example shown in FIG. 5, a first thickness profile 510*a* is associated with a first circumferential portion of the stiffener ring 120 (e.g., the first portion 123), and a second thickness profile 510*b* is associated with a second circumferential portion of the stiffener ring 120 (e.g., the second portion 124). In the example shown in FIG. 5, the first thickness profile 510*a* includes a peak 512*a* and valleys 516*a* and 516*b*, and the second thickness profile 510*b* includes peaks 512*b* and 512*c* and valleys 516*a*, 516*b*, and 516*c*. As illustrated, the valley 516*a* is shared by both the first thickness profile 510*a* and the second thickness profile 510*b* because the thickness profile is continuous around the full circumference (e.g., where θ=0° meets θ=) 360°. In some embodiments, the dotted vertical line at approximately θ=180° can represent a conceptual boundary between the first thickness profile 510*a* and the second thickness profile 510*b* (e.g., a boundary between the first portion 123 and the second portion 124), although a person of ordinary skill in the art would appreciate that the boundary can be located at any suitable angular position depending on the circumferential segmentation selected for the stiffener ring 120.

FIG. 5 illustrates that the first thickness profile 510*a* and the second thickness profile 510*b* can be different from one another, such that thickness variation within the first portion 123 can be different from thickness variation within the second portion 124. In some embodiments, the first portion 123 and the second portion 124 can comprise the same material, and the differing effective stiffnesses of the first portion 123 and the second portion 124 can be established at least in part by the different thickness profiles (e.g., by the first thickness profile 510*a* versus the second thickness profile 510*b*). For example, where thickness is relatively higher (e.g., at a peak such as the peak 512*a*, the peak 512*b*, and the peak 512*c*), the corresponding circumferential location can provide relatively greater bending resistance (and thus a relatively greater effective stiffness) than where thickness is relatively lower (e.g., at a valley such as the valley 516*a*, the valley 516*b*, and the valley 516*c*). Accordingly, in some embodiments, the first thickness profile 510*a* and the second thickness profile 510*b* can be selected to tune stiffness distribution around the stiffener ring 120, for example to provide greater mechanical constraint proximate regions of the substrate 110 where increased warpage control is desired and to provide lesser mechanical constraint proximate regions of the substrate 110 where increased warpage control is less desired.

Although FIG. 5 illustrates the first thickness profile 510*a* and the second thickness profile 510*b* using particular example curves and particular example peaks 512*a*-512*c* and valleys 516*a*-516*c*, a person of ordinary skill in the art would appreciate that the illustrated curves are non-limiting examples. For example, the first thickness profile 510*a* and the second thickness profile 510*b* can be continuous, piecewise-continuous, or piecewise-discrete as a function of θ. As another example, the first thickness profile 510*a* and the second thickness profile 510*b* can include any suitable number of peaks and valleys, the peaks and valleys can have any suitable angular positions, and the peaks and valleys can have any suitable magnitudes (e.g., amplitude), depending on desired stiffness distribution. Further, although FIG. 5 depicts the first thickness profile 510*a* as relatively smoother and the second thickness profile 510*b* as relatively more variable, a person of ordinary skill in the art would appreciate that either profile can be smoother or more variable than the other, provided that the first thickness profile 510*a* and the second thickness profile 510*b* are selected to establish different effective stiffnesses consistent with the present technology.

Further, although FIG. 5 illustrates the first thickness profile 510*a* and the second thickness profile 510*b* as being defined over example angular ranges (e.g., approximately 0°-180° and 180°-360°), a person of ordinary skill in the art would appreciate that the angular extent associated with the first portion 123 and the angular extent associated with the second portion 124 can be selected based on the design of the stiffener ring 120 (e.g., based on the segmentation of the perimeter 121 into the first segment 126 and the second segment 127 described above). Additionally, although FIG. 5 illustrates thickness as a function of θ using an angular coordinate, a person of ordinary skill in the art would appreciate that an equivalent thickness profile can be expressed using any suitable circumferential position coordinate (e.g., arc length along the perimeter 121). In some embodiments, the first thickness profile 510*a* and the second thickness profile 510*b* can be implemented together with other geometry-based features described herein (e.g., geometric transitions between thickness values at boundaries between the first portion 123 and the second portion 124), and the present technology is not limited to any particular manner of parameterizing or implementing the thickness profiles.

Figure 6A:
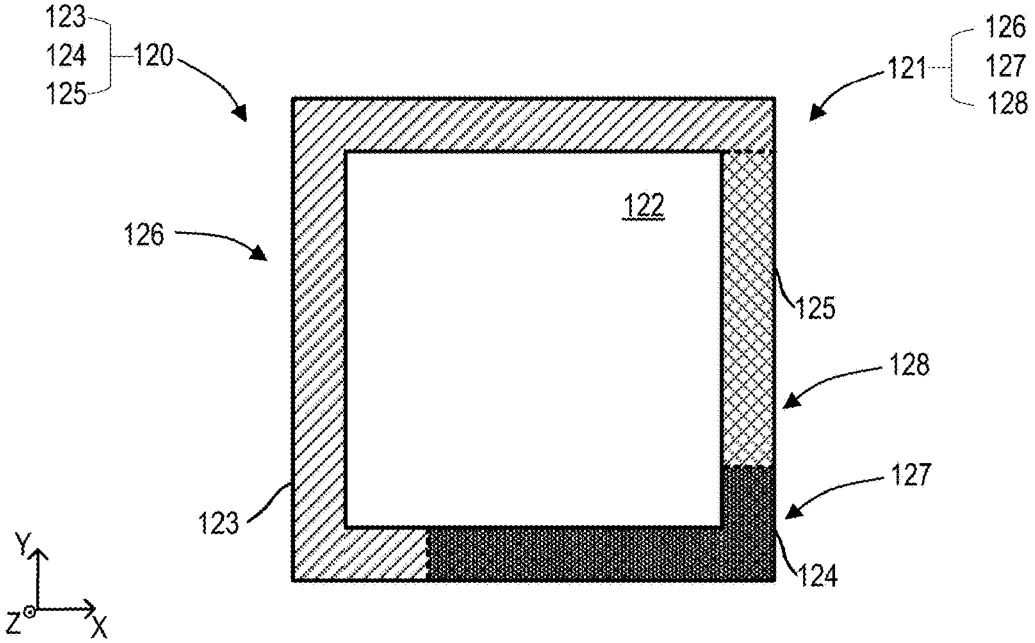
FIG. 6A illustrates an example plan (top) view of a stiffener ring including more than two circumferential portions in accordance with some aspects of the present technology.
Figure 6B:
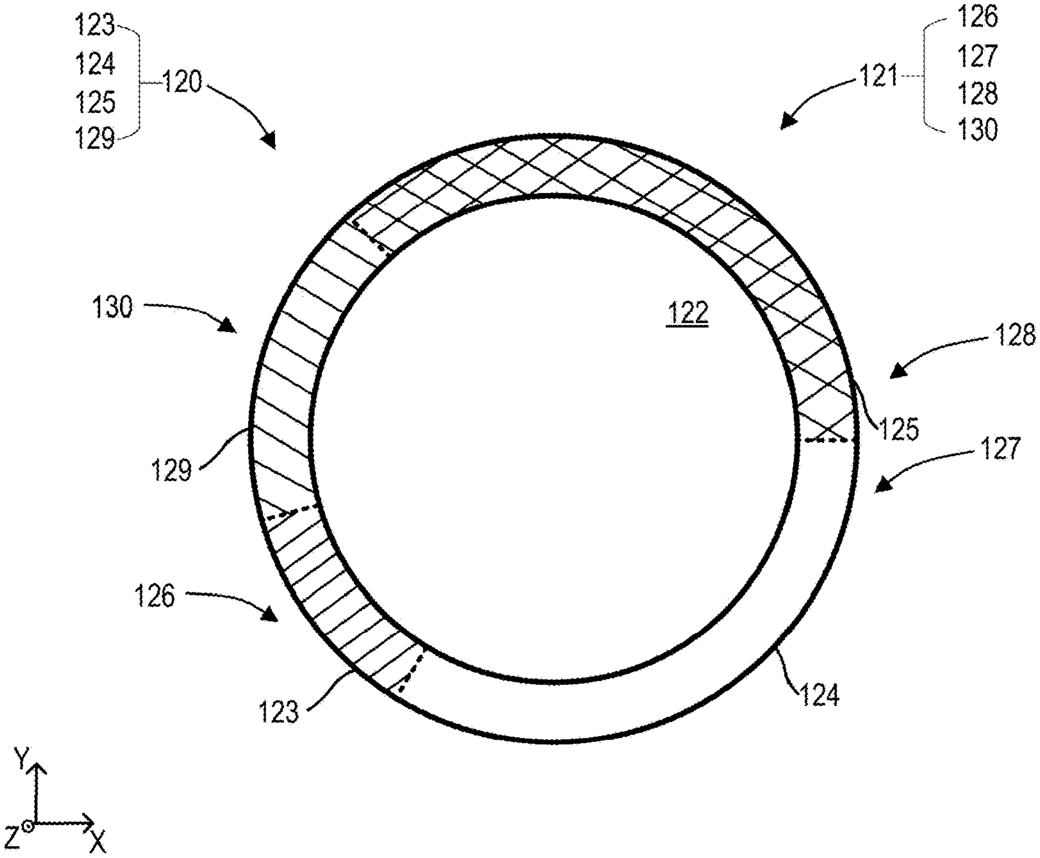
FIG. 6B illustrates another example plan (top) view of a stiffener ring having a different geometry and including more than two circumferential portions in accordance with some aspects of the present technology.

FIG. 6A illustrates an example plan (top) view of a stiffener ring 120 in accordance with some aspects of the present technology. FIG. 6B illustrates another example plan (top) view of a stiffener ring 120 in accordance with some aspects of the present technology. In the examples shown in FIGS. 6A-6B, the stiffener ring 120 defines an opening 122 and includes a perimeter 121. Although FIGS. 6A-6B depict the stiffener ring 120 in isolation for clarity of illustration, a person of ordinary skill in the art would appreciate that the stiffener ring 120 shown in FIGS. 6A-6B can be implemented in the semiconductor package 100 described above (e.g., mounted on the substrate 110 and surrounding at least a portion of the die 115).

In the example shown in FIG. 6A, the stiffener ring 120 includes more than two circumferential portions. In particular, FIG. 6A illustrates that the stiffener ring 120 includes the first portion 123, the second portion 124, and the third portion 125 circumferentially disposed along the perimeter 121 of the stiffener ring 120. For purposes of describing circumferential segmentation, FIG. 6A further illustrates that the perimeter 121 can be conceptually subdivided into the first segment 126, the second segment 127, and the third segment 128, where the first segment 126 corresponds to the first portion 123, the second segment 127 corresponds to the second portion 124, and the third segment 128 corresponds to the third portion 125. In some embodiments, the first portion 123, the second portion 124, and the third portion 125 can be visually differentiated (e.g., using different shading or texture) to indicate that the first portion 123, the second portion 124, and the third portion 125 have different effective stiffnesses.

In the example shown in FIG. 6B, the stiffener ring 120 is depicted with a different geometry than the stiffener ring 120 of FIG. 6A. In particular, FIG. 6B illustrates an annular or circular stiffener ring 120 defining a generally circular opening 122. FIG. 6B further illustrates that the stiffener ring 120 includes four circumferential portions, including the first portion 123, the second portion 124, the third portion 125, and a fourth portion 129. Correspondingly, the perimeter 121 can be conceptually subdivided into the first segment 126, the second segment 127, the third segment 128, and a fourth segment 130, where the first segment 126 corresponds to the first portion 123, the second segment 127 corresponds to the second portion 124, the third segment 128 corresponds to the third portion 125, and the fourth segment 130 corresponds to the fourth portion 129. Although FIG. 6B depicts the stiffener ring 120 as circular, a person of ordinary skill in the art would appreciate that other geometries can be used (e.g., oval, polygonal, rounded-corner, or other non-rectangular shapes), consistent with the present technology.

In some embodiments, implementing more than two circumferential portions (e.g., implementing the stiffener ring 120 with the first portion 123, the second portion 124, and the third portion 125, as shown in FIG. 6A, or implementing the stiffener ring 120 with the first portion 123, the second portion 124, the third portion 125, and the fourth portion 129, as shown in FIG. 6B) can provide increased flexibility and granularity for stiffness engineering. For example, whereas a stiffener ring 120 having only the first portion 123 and the second portion 124 provides two effective stiffness values distributed circumferentially, a stiffener ring 120 having three or more portions can provide three or more effective stiffness values distributed circumferentially, which can enable finer tailoring of mechanical constraint for different regions of a semiconductor package 100. In some embodiments, such increased granularity can be beneficial where warpage behavior of a semiconductor package 100 is spatially non-uniform and varies across multiple regions, and the first portion 123, the second portion 124, the third portion 125, and the fourth portion 129 can be selected to provide region-specific effective stiffnesses in corresponding circumferential locations.

Although FIGS. 6A-6B illustrate particular numbers of portions and particular example geometries, a person of ordinary skill in the art would appreciate that these embodiments are non-limiting examples. For example, the stiffener ring 120 can include any suitable number of circumferential portions (e.g., three portions, four portions, five portions, or more portions), and the circumferential boundaries between portions can be symmetric or asymmetric and can be selected based on desired stiffness distribution, layout constraints, and/or manufacturing considerations. As another example, the first portion 123, the second portion 124, the third portion 125, and the fourth portion 129 can be implemented using any suitable techniques described herein to establish different effective stiffnesses, including, for example, using different materials, using different layered structures, and/or using different geometry (e.g., different thickness) for different portions, provided that the stiffener ring 120 includes multiple circumferential portions having different effective stiffnesses consistent with the present technology.

FIG. 7 illustrates an example method 700 for forming a semiconductor package (e.g., the semiconductor package 100 described above) in accordance with some aspects of the present technology. In the example shown in FIG. 7, the method 700 includes mounting a die (e.g., the die 115 shown in FIGS. 1A-1C) on a substrate (e.g., the substrate 110 shown in FIGS. 1A-1C) at block 702 and mounting a stiffener ring (e.g., the stiffener ring 120 shown in FIGS. 1A-1C) on the substrate at block 704. Although FIG. 7 depicts blocks 702 and 704 in a particular order, a person of ordinary skill in the art would appreciate that the blocks can be performed in other suitable orders and/or in conjunction with other assembly operations, consistent with the present technology.

In block 702, the method 700 includes mounting the die (e.g., the die 115 shown in FIGS. 1A-1C) on the substrate (e.g., the substrate 110 shown in FIGS. 1A-1C). In some embodiments, mounting the die on the substrate can include coupling the die to the substrate using any suitable die-attach technique, including, for example, adhesive attach, solder attach, eutectic attach, thermocompression bonding, hybrid bonding, and/or other suitable attachment techniques. Although the die and substrate are described as being mounted in block 702, a person of ordinary skill in the art would appreciate that the substrate can include additional layers and/or structures (e.g., redistribution layers, interposers, or other package substrate structures) and that the die can include a single die, multiple dies, and/or chiplets, consistent with the present technology.

In block 704, the method 700 includes mounting a stiffener ring (e.g., the stiffener ring 120 shown in FIGS. 1A-1C) on the substrate such that the stiffener ring surrounds at least a portion of the die. In some embodiments, the stiffener ring mounted in block 704 corresponds to the stiffener ring 120 described above and includes at least a first portion (e.g., the first portion 123 shown in FIGS. 1A-1C) and a second portion (e.g., the second portion 124 shown in FIGS. 1A-1C) circumferentially disposed along a perimeter of the stiffener ring. In such embodiments, the first portion is characterized by a first effective stiffness and the second portion is characterized by a second effective stiffness different from the first effective stiffness. In some embodiments, mounting the stiffener ring on the substrate can include positioning and attaching the stiffener ring to the substrate so that the stiffener ring laterally surrounds the region of the substrate in which the die is mounted (e.g., surrounds the die in an X-Y plane), consistent with the embodiments described above.

In some embodiments, the method 700 can further include one or more additional steps not shown in FIG. 7. For example, in some embodiments, the method 700 can include bonding the stiffener ring to the substrate using a bond layer (e.g., an adhesive bond layer), and/or curing or otherwise setting the bond layer. As another example, in some embodiments, the method 700 can include dispensing and curing an underfill between the die and the substrate after mounting the die (and optionally after mounting the stiffener ring) to improve mechanical support and reliability. As another example, in some embodiments, the method 700 can include attaching a lid and/or heat spreader over the die and/or over at least a portion of the stiffener ring, applying a thermal interface material (TIM), and/or attaching a cooling solution (e.g., a heat sink or cold plate). As yet another example, in some embodiments, the method 700 can include attaching the semiconductor package to a printed circuit board (PCB) using solder interconnects and performing a reflow operation. Although these additional steps are described as examples, a person of ordinary skill in the art would appreciate that any suitable combination of assembly steps can be used in conjunction with blocks 702 and 704 depending on package architecture and manufacturing requirements.

Accordingly, FIG. 7 provides a non-limiting example method in which a die is mounted on a substrate and a stiffener ring is mounted on the substrate such that the stiffener ring surrounds at least a portion of the die, where the stiffener ring includes a first portion and a second portion having different effective stiffnesses. A person of ordinary skill in the art would appreciate that the method 700 is not limited to the specific steps shown in FIG. 7, and that additional steps can be added, omitted, combined, repeated, and/or performed in different orders, consistent with the present technology.

Figure 8:
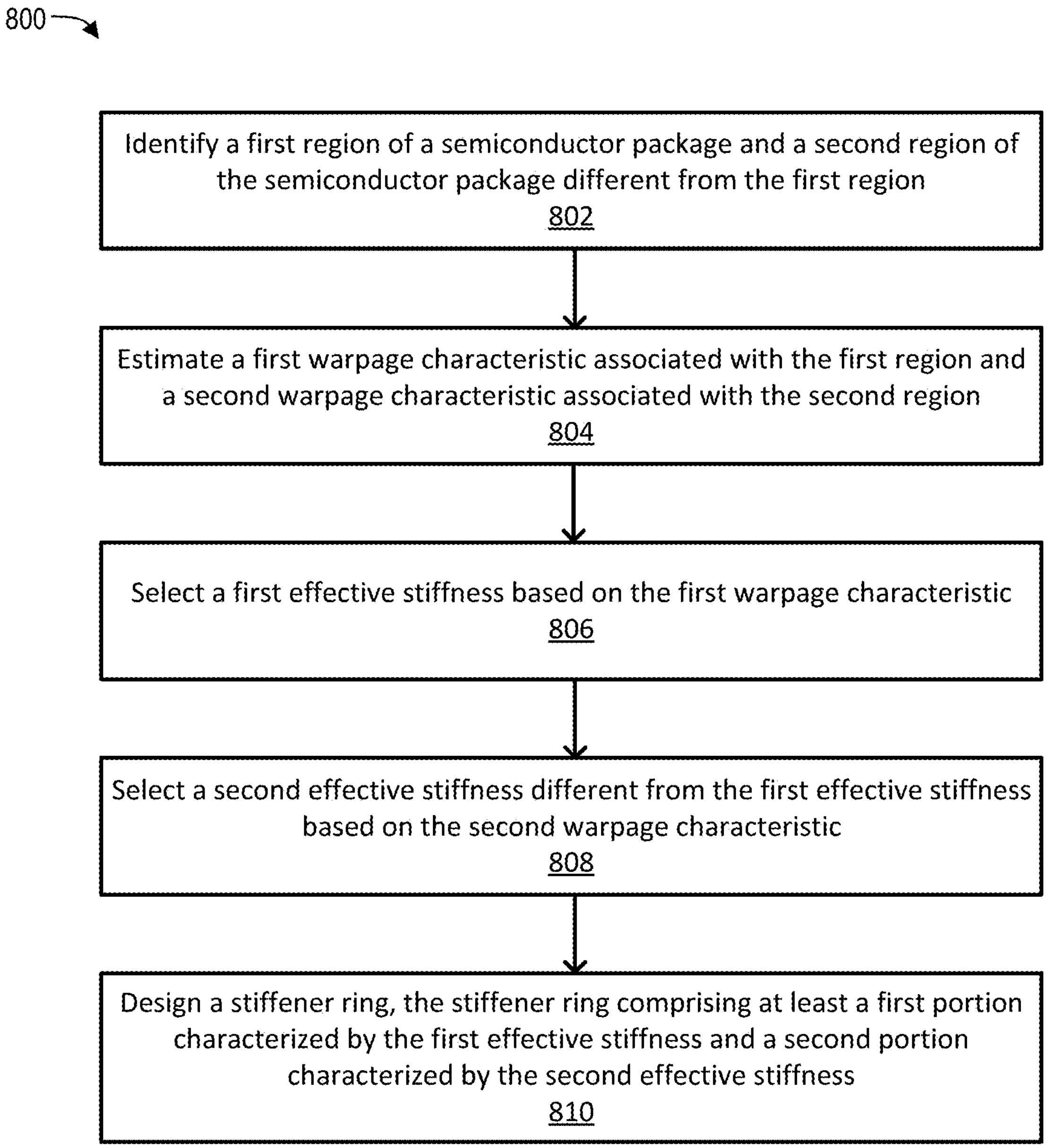
FIG. 8 illustrates an example method for designing a stiffener ring for a semiconductor package in accordance with some aspects of the present technology.

FIG. 8 illustrates an example method 800 for designing a stiffener ring (e.g., the stiffener ring 120 described above with reference to FIGS. 1A-1C) for a semiconductor package (e.g., the semiconductor package 100 described above with reference to FIGS. 1A-1C) in accordance with some aspects of the present technology. In the example shown in FIG. 8, the method 800 includes identifying regions of the semiconductor package at block 802, estimating warpage characteristics associated with the regions at block 804, selecting effective stiffness values based on the estimated warpage characteristics at blocks 806 and 808, and designing a stiffener ring based on the selected effective stiffness values at block 810. Although FIG. 8 depicts blocks 802-810 in a particular order, a person of ordinary skill in the art would appreciate that the blocks can be performed in other suitable orders, repeated, and/or combined with additional design operations, consistent with the present technology.

In block 802, the method 800 includes identifying a first region of the semiconductor package and identifying a second region of the semiconductor package different from the first region. In some embodiments, the first region and the second region can correspond to different locations on the substrate (e.g., different locations on the substrate 110 described above with reference to FIGS. 1A-1C), such as different edge regions, different corner regions, and/or one or more regions proximate a die region versus one or more regions remote from the die region. In some embodiments, the first region and the second region can be selected based on expected warpage sensitivity and/or expected mechanical loading (e.g., a region anticipated to experience relatively higher out-of-plane deformation versus a region anticipated to experience relatively lower out-of-plane deformation). Although block 802 is described in the context of identifying two regions, a person of ordinary skill in the art would appreciate that additional regions can be identified in other embodiments (e.g., three regions, four regions, or more regions), consistent with implementing a stiffener ring having more than two circumferential portions (e.g., as described above with reference to FIGS. 6A-6B).

In block 804, the method 800 includes estimating a first warpage characteristic associated with the first region and estimating a second warpage characteristic associated with the second region. In some embodiments, a warpage characteristic can include one or more quantitative or qualitative descriptors of out-of-plane deformation for a corresponding region, such as a magnitude of displacement, a peak-to-valley displacement metric, a curvature metric, a bow metric, a directionality metric, and/or an indication of concave or convex warpage state. In some embodiments, the first warpage characteristic and the second warpage characteristic can be estimated for one or more temperatures relevant to assembly and/or operation (e.g., at or near an ambient/room-temperature condition, at or near a maximum operating temperature condition, and/or at or near a reflow temperature condition). Although warpage characteristics are described above as examples, a person of ordinary skill in the art would appreciate that any suitable warpage metric(s) can be used in block 804 depending on design objectives and available data.

In some embodiments, estimating the first warpage characteristic and the second warpage characteristic in block 804 can include simulation-based estimation and/or measurement-based estimation. For example, in some embodiments, simulation-based estimation can include performing a finite element analysis (FEA) or other mechanical modeling of the semiconductor package (e.g., the semiconductor package 100 described above with reference to FIGS. 1A-1C) to estimate warpage behavior under thermomechanical loading (e.g., including effects of CTE mismatch among package constituents). As another example, in some embodiments, measurement-based estimation can include measuring warpage of a prototype package or a reference package using optical warpage metrology techniques such as shadow moiré and/or other profilometry techniques, and deriving the first warpage characteristic and the second warpage characteristic from a measured displacement map. In some embodiments, the estimating in block 804 can further include generating a warpage map across the semiconductor package and associating different regions (e.g., the first region and the second region) with corresponding warpage characteristics derived from the warpage map. Although these approaches are described as examples, a person of ordinary skill in the art would appreciate that any suitable combination of simulation and/or measurement can be used to estimate warpage characteristics in block 804.

In block 806, the method 800 includes selecting a first effective stiffness based on the first warpage characteristic. In some embodiments, selecting the first effective stiffness can include selecting an effective stiffness value, selecting an effective stiffness range, and/or selecting one or more structural parameters expected to produce the first effective stiffness when implemented in a stiffener ring portion. In some embodiments, where the first region exhibits relatively severe warpage (e.g., relatively high out-of-plane deformation or curvature), the first effective stiffness selected in block 806 can be selected to provide relatively greater mechanical constraint proximate the first region. In other embodiments, where the first region exhibits relatively mild warpage, the first effective stiffness selected in block 806 can be selected to provide relatively lesser mechanical constraint proximate the first region to avoid unnecessary stiffening. Although block 806 is described as selecting the first effective stiffness based on the first warpage characteristic, a person of ordinary skill in the art would appreciate that the selection can be performed using any suitable approach, including, for example, design rules, parameter sweeps, optimization routines, and/or iterative simulation.

In block 808, the method 800 includes selecting a second effective stiffness different from the first effective stiffness based on the second warpage characteristic. In some embodiments, selecting the second effective stiffness can be performed in a manner similar to selecting the first effective stiffness, but based on the second warpage characteristic associated with the second region. In some embodiments, the second effective stiffness can be selected to be higher than the first effective stiffness or lower than the first effective stiffness depending on whether the second region is targeted for increased mechanical constraint or decreased mechanical constraint relative to the first region. Although block 808 is described in the context of selecting a second effective stiffness different from the first effective stiffness, a person of ordinary skill in the art would appreciate that additional effective stiffness values can be selected in other embodiments corresponding to additional regions (e.g., for a stiffener ring having three portions, four portions, or more portions), consistent with the present technology.

In block 810, the method 800 includes designing a stiffener ring comprising at least a first portion (e.g., the first portion 123 described above with reference to FIGS. 1A-1C) characterized by the first effective stiffness and a second portion (e.g., the second portion 124 described above with reference to FIGS. 1A-1C) characterized by the second effective stiffness. In some embodiments, designing the stiffener ring in block 810 can include determining a circumferential segmentation of the stiffener ring (e.g., determining boundary locations between portions along the perimeter 121 described above with reference to FIGS. 1A-1C), assigning the first effective stiffness to the first portion and assigning the second effective stiffness to the second portion, and selecting one or more implementation parameters for each portion to achieve the assigned effective stiffness. For example, in some embodiments, the first portion and the second portion can be configured to have different effective stiffnesses by selecting different materials, selecting different layered structures, selecting different thickness values, and/or selecting different transition geometries between portions, as described above. Although block 810 is described as designing a stiffener ring with two portions, a person of ordinary skill in the art would appreciate that the method 800 can be extended to design stiffener rings having more than two portions, and that the design process can be iterative (e.g., repeating blocks 804-810) until a desired warpage performance is achieved, consistent with the present technology.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware, and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

ASPECTS

The present technology includes the aspects presented below:

Aspect 1. A semiconductor package comprising: a substrate; a die mounted on the substrate; and a stiffener ring mounted on the substrate and surrounding at least a portion of the die, the stiffener ring comprising at least a first portion and a second portion circumferentially disposed along a perimeter of the stiffener ring, wherein the first portion is characterized by a first effective stiffness, and the second portion is characterized by a second effective stiffness different from the first effective stiffness.

Aspect 2. The semiconductor package of Aspect 1, wherein the stiffener ring is configured, by the first effective stiffness and the second effective stiffness, to reduce warpage of the semiconductor package across a temperature range.

Aspect 3. The semiconductor package of Aspect 2, wherein the temperature range comprises a reflow temperature.

Aspect 4. The semiconductor package of Aspect 2, wherein the temperature range is between an ambient temperature and a reflow temperature.

Aspect 5. The semiconductor package of Aspect 1, wherein a difference between the first effective stiffness and the second effective stiffness is established by at least one of: a varying thickness profile between the first portion and the second portion; or a varying material composition between the first portion and the second portion.

Aspect 6. The semiconductor package of Aspect 5, wherein the first portion comprises a first material, and the second portion comprises a second material different from the first material.

Aspect 7. The semiconductor package of Aspect 6, wherein at least one of the first material or the second material comprises a metal.

Aspect 8. The semiconductor package of Aspect 6, wherein at least one of the first material or the second material comprises a non-metal material.

Aspect 9. The semiconductor package of Aspect 6, wherein at least one of the first material or the second material comprises a composite material.

Aspect 10. The semiconductor package of Aspect 6, wherein at least one of the first material or the second material comprises a carbon-based material.

Aspect 11. The semiconductor package of Aspect 10, wherein the carbon-based material comprises at least one of carbon fiber or carbon nanotubes.

Aspect 12. The semiconductor package of Aspect 6, wherein the first material comprises a metal and the second material comprises a carbon-based material.

Aspect 13. The semiconductor package of Aspect 12, wherein the metal comprises at least one of stainless steel, copper, or titanium.

Aspect 14. The semiconductor package of Aspect 6, wherein the first portion comprises a first laminated structure including a first plurality of layers, and the second portion comprises a second laminated structure including a second plurality of layers.

Aspect 15. The semiconductor package of Aspect 14, wherein the first laminated structure of the first portion and the second laminated structure of the second portion differ in at least one of (i) a number of layers, (ii) layer thicknesses, or (iii) layer material compositions.

Aspect 16. The semiconductor package of Aspect 5, wherein the first portion is characterized by a first thickness, and the second portion is characterized by a second thickness different from the first thickness.

Aspect 17. The semiconductor package of Aspect 16, wherein a transition between the first thickness and the second thickness is a stepped transition.

Aspect 18. The semiconductor package of Aspect 16, wherein a transition between the first thickness and the second thickness is a tapered transition.

Aspect 19. The semiconductor package of Aspect 16, wherein the first portion comprises a first thickness profile that varies within the first portion.

Aspect 20. The semiconductor package of Aspect 19, wherein the second portion comprises a second thickness profile that varies within the second portion, the second thickness profile being different from the first thickness profile.

Aspect 21. The semiconductor package of Aspect 1, wherein the stiffener ring further comprises a third portion circumferentially disposed along the perimeter of the stiffener ring, wherein the third portion is characterized by a third effective stiffness different from the first effective stiffness and the second effective stiffness.

Aspect 22. The semiconductor package of Aspect 1, wherein the first effective stiffness is selected based on a first warpage characteristic associated with a first region of the semiconductor package, and wherein the second effective stiffness is selected based on a second warpage characteristic associated with a second region of the semiconductor package different from the first region.

Aspect 23. A method comprising: mounting a die on a substrate; and mounting a stiffener ring on the substrate such that the stiffener ring surrounds at least a portion of the die, the stiffener ring comprising at least a first portion and a second portion circumferentially disposed along a perimeter of the stiffener ring, wherein the first portion is characterized by a first effective stiffness, and the second portion is characterized by a second effective stiffness different from the first effective stiffness. In a sub-aspect, a difference between the first effective stiffness and the second effective stiffness is established by at least one of: a varying thickness profile between the first portion and the second portion; or a varying material composition between the first portion and the second portion.

Aspect 24. A method comprising: identifying a first region of the semiconductor package and a second region of the semiconductor package different from the first region; estimating a first warpage characteristic associated with the first region and a second warpage characteristic associated with the second region; selecting a first effective stiffness based on the first warpage characteristic; selecting a second effective stiffness different from the first effective stiffness based on the second warpage characteristic; and designing a stiffener ring, the stiffener ring comprising at least a first portion characterized by the first effective stiffness and a second portion characterized by the second effective stiffness.

Aspect 25. A stiffener ring comprising: a perimeter defining an opening; a first portion circumferentially disposed along a first segment of the perimeter, wherein the first portion is characterized by a first effective stiffness; and a second portion circumferentially disposed along a second segment of the perimeter, wherein the second portion is characterized by a second effective stiffness different from the first effective stiffness.

Aspect 26. The stiffener ring of Aspect 25, wherein a difference between the first effective stiffness and the second effective stiffness is established by at least one of: a varying thickness profile between the first portion and the second portion; or a varying material composition between the first portion and the second portion.

What is claimed is:

1. A semiconductor package comprising:

a substrate;

a die mounted on the substrate; and a stiffener ring mounted on the substrate and surrounding at least a portion of the die, the stiffener ring comprising at least a first portion and a second portion circumferentially disposed along a perimeter of the stiffener ring, wherein the first portion is characterized by a first effective stiffness, and the second portion is characterized by a second effective stiffness different from the first effective stiffness, wherein a difference between the first effective stiffness and the second effective stiffness is established by a varying thickness profile between the first portion and the second portion, and wherein the first portion is characterized by a first thickness, and the second portion is characterized by a second thickness different from the first thickness, and wherein a transition between the first thickness and the second thickness is a stepped transition or a tapered transition.

2. The semiconductor package of claim 1, wherein the stiffener ring is configured, by the first effective stiffness and the second effective stiffness, to reduce warpage of the semiconductor package across a temperature range.

3. The semiconductor package of claim 2, wherein the temperature range is between an ambient temperature and a reflow temperature.

4. The semiconductor package of claim 1, wherein the difference between the first effective stiffness and the second effective stiffness is further established by a varying material composition between the first portion and the second portion.

5. The semiconductor package of claim 4, wherein the first portion comprises a first material, and the second portion comprises a second material different from the first material.

6. The semiconductor package of claim 5, wherein at least one of the first material or the second material comprises a non-metal material.

7. The semiconductor package of claim 5, wherein at least one of the first material or the second material comprises at least one of carbon fiber or carbon nanotubes.

8. The semiconductor package of claim 5, wherein the first portion comprises a first laminated structure including a first plurality of layers, and the second portion comprises a second laminated structure including a second plurality of layers.

9. The semiconductor package of claim 8, wherein the first laminated structure of the first portion and the second laminated structure of the second portion differ in at least one of (i) a number of layers, (ii) layer thicknesses, or (iii) layer material compositions.

10. The semiconductor package of claim 1, wherein the first portion comprises a first thickness profile that varies within the first portion.

11. The semiconductor package of claim 10, wherein the second portion comprises a second thickness profile that varies within the second portion, the second thickness profile being different from the first thickness profile.

12. The semiconductor package of claim 1, wherein the stiffener ring further comprises a third portion circumferentially disposed along the perimeter of the stiffener ring, wherein the third portion is characterized by a third effective stiffness different from the first effective stiffness and the second effective stiffness.

13. The semiconductor package of claim 1, wherein the first effective stiffness is selected based on a first warpage characteristic associated with a first region of the semiconductor package, and wherein the second effective stiffness is selected based on a second warpage characteristic associated with a second region of the semiconductor package different from the first region.

14. A stiffener ring comprising:

a perimeter defining an opening;

a first portion circumferentially disposed along a first segment of the perimeter, wherein the first portion is characterized by a first effective stiffness; and a second portion circumferentially disposed along a second segment of the perimeter, wherein the second portion is characterized by a second effective stiffness different from the first effective stiffness, wherein a difference between the first effective stiffness and the second effective stiffness is established by a varying thickness profile between the first portion and the second portion, and wherein the first portion is characterized by a first thickness, and the second portion is characterized by a second thickness different from the first thickness, and wherein a transition between the first thickness and the second thickness is a stepped transition or a tapered transition.

15. The stiffener ring of claim 14, wherein a difference between the first effective stiffness and the second effective stiffness is established by at least one of:

a varying thickness profile between the first portion and the second portion; or a varying material composition between the first portion and the second portion.

16. A method comprising:

mounting a die on a substrate; and mounting a stiffener ring on the substrate such that the stiffener ring surrounds at least a portion of the die, the stiffener ring comprising at least a first portion and a second portion circumferentially disposed along a perimeter of the stiffener ring, wherein the first portion is characterized by a first effective stiffness, and the second portion is characterized by a second effective stiffness different from the first effective stiffness, wherein a difference between the first effective stiffness and the second effective stiffness is established by a varying thickness profile between the first portion and the second portion, and wherein the first portion is characterized by a first thickness, and the second portion is characterized by a second thickness different from the first thickness, and wherein a transition between the first thickness and the second thickness is a stepped transition or a tapered transition.

17. The method of claim 16, wherein a difference between the first effective stiffness and the second effective stiffness is established by at least one of:

a varying thickness profile between the first portion and the second portion; or a varying material composition between the first portion and the second portion.

* * * * *